(12) United States Patent
Nozoe et al.

(10) Patent No.: US 6,703,850 B2
(45) Date of Patent: Mar. 9, 2004

(54) METHOD OF INSPECTING CIRCUIT PATTERN AND INSPECTING INSTRUMENT

(75) Inventors: Mari Nozoe, Hino (JP); Hiroyuki Shinada, Chofu (JP); Kenji Watanabe, Ome (JP); Keiichi Saiki, Hitachinaka (JP); Aritoshi Sugimoto, Tokyo (JP); Hiroshi Morioka, Higashimurayama (JP); Maki Tanaka, Yokohama (JP); Hiroshi Miyai, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/430,188

(22) Filed: May 7, 2003

(65) Prior Publication Data

US 2003/0206027 A1 Nov. 6, 2003

Related U.S. Application Data

(63) Continuation of application No. 09/559,563, filed on Apr. 27, 2000, now Pat. No. 6,583,634.

(30) Foreign Application Priority Data

Apr. 28, 1999 (JP) ........................................... 11-122565

(51) Int. Cl.[7] ............................................ G01R 31/305

(52) U.S. Cl. ..................................... 324/751; 250/310

(58) Field of Search ............................... 324/750, 751; 250/310, 311

(56) References Cited

U.S. PATENT DOCUMENTS

| | | | |
|---|---|---|---|
| 4,807,159 A | 2/1989 | Komatsu et al. | 364/524 |
| 5,051,585 A | 9/1991 | Koshishiba et al. | 250/306 |

(List continued on next page.)

FOREIGN PATENT DOCUMENTS

| | | |
|---|---|---|
| JP | 59-155941 | 9/1984 |
| JP | 59-160948 | 9/1984 |
| JP | 2-15546 | 1/1990 |
| JP | 3-167456 | 7/1991 |
| JP | 5-258703 | 10/1993 |
| JP | 6-58220 | 8/1994 |
| JP | 6-338280 | 12/1994 |
| JP | 10-294345 | 11/1998 |

OTHER PUBLICATIONS

Monthly Semiconductor World, Aug. 1995, pp. 96–99.
Electron, Ion Beam Handbook (Nikkan Kogyo Shimbunsha), pp. 622–623.

(List continued on next page.)

*Primary Examiner*—Evan Pert
*Assistant Examiner*—Russell M. Kobert
(74) *Attorney, Agent, or Firm*—Mattingly, Stanger & Malur, P.C.

(57) ABSTRACT

In order to obtain optimum irradiation conditions of an electron beam according to the material and structure of a circuit pattern to be inspected and the kind of a failure to be detected and inspect under the optimum conditions without delay of the inspection time, an inspection device for irradiating the electron beam 19 to the sample board 9 which is a sample, detecting generated secondary electrons by the detector 7, storing obtained signals sequentially in the storage, comparing the same pattern stored in the storage by the comparison calculation unit, and extracting a failure by comparing the predetermined threshold value with the comparison signal by the failure decision unit is provided, wherein the optimum value of the irradiation energy is stored in the data base inside the device beforehand according to the structure of a sample and a recommended value of the irradiation energy suited to inspection can be searched for by inputting or selecting the irradiation energy by a user or inputting information regarding the structure of an article to be inspected.

6 Claims, 22 Drawing Sheets

U.S. PATENT DOCUMENTS

| | | | |
|---|---|---|---|
| 5,502,306 A | | 3/1996 | Meisburger et al. ........ 250/310 |
| 5,528,156 A | | 6/1996 | Ueda et al. ................. 324/751 |
| 5,548,211 A | | 8/1996 | Tujide et al. ............ 324/158.1 |
| 5,576,833 A | * | 11/1996 | Miyoshi et al. ............ 356/394 |
| 5,592,100 A | | 1/1997 | Shida et al. ................ 324/751 |
| 6,232,787 B1 | * | 5/2001 | Lo et al. ..................... 324/751 |
| 6,252,412 B1 | * | 6/2001 | Talbot et al. ............... 324/750 |
| 6,258,437 B1 | * | 7/2001 | Jarvis ......................... 428/137 |

OTHER PUBLICATIONS

Journal of Vacuum Science, Tech. B., vol. 9, No. 6, 1991, pp. 3005–3009.

Journal of Vacuum Science, Tech. B., vol. 10, No. 6, 1992, pp. 2804–2808.

FIG. 3
(a) NORMALLY PROCESSED PATTERN
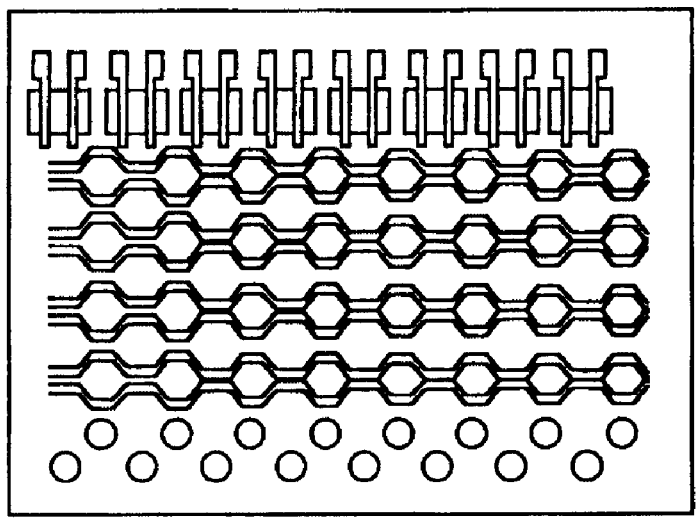
(b) FAILURE-GENERATED PATTERN
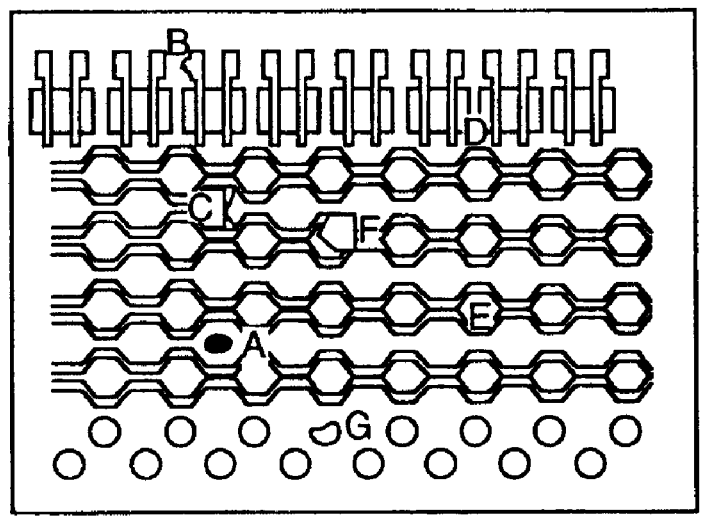
A: ISOLATED DEFECT
B: PROTECTION
C: SHORT
D: LACK PATTERN
E: OPEN WIRING
F: THIN-FILM REMAIN
G: OPEN VIA

FIG. 6

| WAFER INFORMATION | CLASSI-FICATION | CONTENTS ETC. | ENERGY RANGE | MOST SURTABLE ENERGY RANGE |
|---|---|---|---|---|
| PATTERNNING PROCESS | HOLE | AFTER DEVEL OPEMENT | 1kV~3kV | 1.5kV~3kV |
| | | AFTER ETCHING | 1kV~5kV | 1.5kV~3kV |
| | | AFTER FILLING OF CONDUCTIVE METERIAL | 0.3kV~3kV | 0.3kV~0.5kV |
| | LINE | CONDUCTOR MELERIAL (METAL, SUBMETAL) / INSULATOR MATERIAL | 0.3kV~5kV | 1kV~3kV |
| | | IN CASE OF SiN OR TiN COVERAGE ON THE EONDUCTN SURFACE | 1.5kV~5kV | 1.5kV~3kV |
| STEP | HIGH STEP | HOLE WITH HIGH ASPECT RATIO | 1.5kV~5kV | 3kV |
| | | LINE WITH HIGH STEP | | |
| | | CAPACITOR | | |
| | MIDOLE STEP | GATE LINE | 0.8kV~3kV | 0.8kV~1.5kV |
| | | LOW ASPECT HOLE | | |
| | LOW STEP | AFTERFILLING (ETCHING BACK, CMP POLISHING ETC) | 0.3kV~1kV | 0.5kV |
| KIND OF DEFFECT | ELECTRICAL FAILUE | NON CONTACT HOLE | 0.3kV~3kV | 0.5kV~0.8kV |
| | | TRANSISTOR SHORT | | |
| | THIN FILM REMAIN | | 0.3kV~3kV | 0.5kV |
| | PATTERN DEFFECT | SHORT, ISOLATION DEFFECT PROJECTION LACK | 1kV~5kV | 1kV~3kV |
| | PARTICLE | | 0.5kV~3kV | 1.5kV~3kV |

RECIPE MAKING SCREEN

INPUT BUTTUM (CLICK)

ELECTRUN IRRADIATION EUERGY

DIRECT DATA INPUT

METHOD OF INSPECTING CIRCUIT PATTERN AND INSPECTING INSTRUMENT

This is a continuation application of U.S. Ser. No. 09/559,563, filed Apr. 27, 2000, now U.S. Pat. No. 6,583,634.

BACKGROUND OF THE INVENTION

The present invention relates to a manufacturing method and device of a board having a fine circuit pattern such as a semiconductor device or a liquid crystal and more particularly to a pattern inspection art of a semiconductor device and a photo mask such as a pattern inspection art on a wafer during the semiconductor device manufacturing process and a comparison inspection art using an electron beam.

Inspection of a semiconductor wafer will be explained as an example.

A semiconductor device is manufactured by repeating the step of transferring a pattern formed on a photo mask onto a semiconductor wafer by the lithographic process and etching process. In the semiconductor device manufacturing process, acceptance or rejection of the lithographic process, etching process, and others and an occurrence of a foreign substance greatly affect the yield rate of semiconductor devices, so that to detect an error or failure generation early or beforehand, the method for inspecting a pattern on a semiconductor wafer in the manufacturing process has been conventionally executed.

As a method for inspecting a defect existing in a pattern on a semiconductor wafer, a defect inspection device for irradiating white light to a semiconductor wafer and comparing the same kind of circuit patterns of a plurality of LSIs using an optical image is in practical use and the outline of the inspection method is described in "Monthly Semiconductor World", August issue, 1995, pp 96 to 99. As an inspection method using an optical image, a method for imaging an optically irradiated area on a board by a time delay integration sensor and detecting a defect by comparing the image with a preinput design characteristic is disclosed in Japanese Patent Application Laid-Open 3-167456 and a method for monitoring image deterioration at the time of image acquisition and correcting it at the time of image detection and thereby executing a comparison inspection using a stable optical image is disclosed in Japanese Patent Publication 6-58220. When a semiconductor wafer in the manufacturing process is inspected by such an optical inspection system, pattern remains and defects having a silicon oxide film or photosensitive resist material on the surface through which light transmits cannot:be detected. Etching remains and an unopened failure of the minute contact hole lower than the resolution of the optical system cannot be detected. Furthermore, a defect generated at the step bottom of the line pattern cannot be detected.

As mentioned above, as refinement of the circuit pattern, complication of the circuit pattern shape, and diversification of the material advance, defect detection by an optical image becomes difficult, so that a method for comparing and inspecting the circuit pattern using an electron beam image having a higher resolution than that of an optical image is proposed. When the circuit pattern is to be compared and inspected by an electron beam image, to obtain a practical inspection time, it is necessary to obtain an image at a very higher speed than that of observation by a scanning electron microscope (hereinafter abbreviated to SEM). It is also necessary to ensure the resolution of the image obtained at high speed and the SN ratio of the image.

As a pattern comparison inspection device using an electron beam, in J. Vac. Sci., Tech. B, Vol. 9, No. 6, pp 3005 to 3009 (1991), J. Vac. Sci., Tech. B, Vol. 10, No. 6, pp 2804 to 2808 (1992), Japanese Patent Application Laid-Open 5-258703, and USP 5502306, a method for irradiating an electron beam having an electron beam current 100 times or more: (10 nA or more) of that of a normal SEM to a conductive board (X-raymask, etc.), detecting any of generated secondary electrons, reflected electrons, and transmitted electrons, and comparing and inspecting images formed from the signal and thereby automatically detecting a defect is disclosed.

As a method for inspecting or observing a circuit board having an insulator by an electron beam, in Japanese Patent Application Laid-Open 59-155941 and Electron, Ion Beam Handbook (Nikkan Kogyo Shimbunsha), pp 622 and 623, a method:for obtaining a stable image by irradiating a low velocity electron beam of 2 keV or less so as to reduce the effect of charging is disclosed. Furthermore, in Japanese Patent Application Laid-Open 2-15546, a method for irradiating ions from the back of a semiconductor board is disclosed and in Japanese Patent Application Laid-Open 6-338280, a method for canceling charging an insulator by irradiating light to the surface of a semiconductor board is disclosed.

By a large current and low velocity electron beam, it is difficult to obtain an image with high resolution due to the space charge effect. However, as a method for solving it, in Japanese Patent Application Laid-Open 5-258703, a method for decelerating a high velocity electron beam immediately before a sample and irradiating it practically as a low velocity electron beam on the sample is disclosed.

As a method for obtaining an electron beam image at high speed, a method for obtaining an electron beam image by continuously irradiating an electron beam on a semiconductor wafer on a sample carrier by continuously moving the sample carrier is disclosed in Japanese Patent Application Laid-Open 59-160948 and Japanese Patent Application Laid-Open 5-258703. As a secondary electron detection device used in a conventional SEM, a constitution of a scintillator (aluminum deposited phosphor), a light guide, and a photoelectric multiplier is used. However, this kind of detection device detects light emitted from the phosphor, so that the frequency responsibility is bad and the detection device is not suited to high-speed formation of an electron beam image. To solve this problem, as a detection device for detecting a secondary electron signal of high frequency, a detection means using a semiconductor detector is disclosed in Japanese Patent Application Laid-Open 5-258703. Furthermore, an art for scanning an electron beam at the same location on a semiconductor wafer on a sample carrier once or several times at high speed by continuously moving the sample carrier, obtaining an image at high speed, and automatically inspecting a defect by image comparison is disclosed in Japanese Patent Application Laid-Open 10-294345.

When the circuit pattern in the manufacturing process of a semiconductor device having a minute structure is inspected using the aforementioned optical inspection system of the prior art, remains of a silicon oxide film which is an optically transmissive material and whose optical distance depending on the optical wave length and refractive index used for inspection is sufficiently small and a photosensitive resist material cannot be detected and it is difficult to detect etching remains whose linear short width is smaller than the resolution and an unopened failure of the minute contact hole.

On the other hand, in observation and inspection using an SEM, the conventional electron beam image forming method using an SEM requires an extremely long time, so that inspection of the circuit pattern overall a semiconductor wafer requires an extremely longtime. Therefore, to obtain a practical throughput in the semiconductor device manufacturing process, it is necessary to obtain an electron beam image at a very high speed, ensure the S/N ratio of an electron beam image obtained at high speed, and maintain the predetermined accuracy. When the material constituting the circuit pattern to be inspected is formed by an insulating material such as a photo resist or a silicon oxide film and formed by coexistence of an insulating material and a conductive material, it is difficult to obtain an image of stable brightness by inspection by an electron beam and obtain the predetermined inspection accuracy. The reason is that when an electron beam is irradiated to a substance, secondary electrons are generated from the portion, but since the irradiated current is not equal to the secondary electron current, when the inspection object is an insulator, it is charged, and the secondary electron generation efficiency from the portion and the trajectory of secondary electrons after generation are adversely affected, and the contrast of an image is changed, and the image is not reflected by the actual circuit pattern shape and distorted at the same time. This charging state is sensitive to the electron beam irradiation condition and when the electron beam irradiation speed and irradiation range are changed, even the same circuit pattern at the same location becomes an image having an exactly different contrast. As a result, depending on a combination of a material to be inspected or the shape and others, there is a case that the contrast necessary to recognize the existence of a defect cannot be obtained from the obtained image.

As described in the aforementioned prior art, to detect a defect which cannot be detected by theoptical inspection method, as a method for irradiating an electron beam to a conductive board, obtaining an electron beam image, and comparing and inspecting it, a method for irradiating and inspecting an electron beam narrowly limited to a sample board at high speed is disclosed in Japanese Patent Application Laid-Open 59-160948 and Japanese Patent Application Laid-Open 5-258703. However, in this prior art, a method for adjusting inspection conditions for a material such as an insulator, the shape of a pattern to be inspected, and a defect to be detected is not described. In Japanese Patent Application Laid-Open 59-155941 which is another prior art, to observe a board having an insulator, a method for decelerating a primary electron beam to be irradiated to the sample board and reducing the irradiation energy, for example, to 2 keV or less is described. However, this prior art is a method for continuously irradiating an electron beam to a certain local area and obtaining an image after the charging of this local area is stabilized and it is not suited to inspect a wide area at high speed because it requires a long time to obtain an electron beam image. Furthermore, even if the charging in the local area is stabilized, it is difficult to control another area to be compared to the same charging state and for example, it is difficult to inspect a wide area such as a semiconductor wafer. In Japanese Patent Application Laid-Open 10-294345, a method for irradiating a large current electron beam to a circuit pattern to be inspected only once, detecting a signal at high speed in the state before the contrast is changed, thereby equalizing the charging state of a wide area, and obtaining an electron beam image with a stable contrast is disclosed. In this prior art, the degree of charging varies with a material, so that a method for adjusting the irradiation energy of an electron beam irradiated to a sample by adjusting the negative potential applied to the sample and sample carrier is described. However, in this prior art, there is no concrete description on setting the shape and material of a pattern to be inspected and irradiation conditions of an electron beam to a defect to be detected.

Namely, in an inspection method and inspection device for forming an image at high speed by scanning a large-current electron beam to a sample at high speed as mentioned above and detecting a defect by the image process, the image quality is different from that of a normal SEM. There is little contour information and the pattern shape and existence of a defect must be discriminated by the contrast by the material and shape. Therefore, when the pattern portion on the surface and the lower layer are not contrasted, the pattern portion cannot be recognized and as a result, it is difficult to detect a defect of the pattern. A failure such as a conduction failure of a hole pattern or a short failure between neighboring independent transistors can be recognized as a contrast different from that of a normal pattern by the potential contrast caused by the difference in the charging state of the sample surface when an electron beam is irradiated. However, depending on irradiation conditions of an electron beam, there is a case that no difference is caused in the contrast between the normal area and the defective area and detection of a defective portion is difficult.

Therefore, depending on the kind of a circuit pattern to be inspected and the step to be inspected, the material, shape, step, and kind of a defect to be detected are changed and the contrast characteristic of an electron beam image is different between the material, shape, step, and kind of defect, so that it is necessary to obtain respective optimum electron beam irradiation conditions beforehand as conditions at the time of inspection.

SUMMARY OF THE INVENTION

An object of the present invention is to provide an inspection method and inspection device for inspecting a semiconductor circuit pattern using an electron beam image, wherein by obtaining a contrast trend beforehand and storing it as a device parameter, there is no need to search for electron beam irradiation conditions suited to inspection for various inspection circuit patterns each time.

Another object of the present invention is to reduce the time for searching for optimum electron beam irradiation conditions whenever inspection conditions of a circuit pattern to be inspected, that is, an inspection recipe is to be set by accomplishing the aforementioned first object.

Still another object of the present invention is to provide an art for promptly corresponding to inspection of all circuit patterns to be inspected by accomplishing the aforementioned first and second objects.

A further object of the present invention is to enhance the sensitivity for detecting various defects in various circuit patterns by accomplishing the aforementioned first to third objects.

A still further object of the present invention is to provide a device wherein optimum electron beam irradiation conditions are presented according to the aforementioned circuit patterns and the conditions are set as inspection condition parameters and built as a data base so that conditions can be set optionally and to accomplish the aforementioned first to fourth objects. Yet a further object of the present invention is to solve the aforementioned first to fifth problems, provide an art for inspecting a circuit pattern with high precision and in high sensitivity according to a circuit pattern to be inspected, and provide an inspection method for reflecting the inspection results in the manufacturing conditions of semiconductors and others by applying the inspection to a minute circuit pattern of a semiconductor device and others and contributing to enhancing the reliability of semiconductor devices and others and also reducing the failure rate.

A board having a minute circuit pattern such as a semiconductor device and others is formed by combining various conductive layers and insulating layers. The structure of a circuit pattern varies with the function and specification of the circuit. When the material and structure are different, the process of manufacturing a circuit pattern and the manufacturing device to be used are different, so that the contents of a defect generated are also different. Furthermore, when the size of a circuit pattern is different, the allowance of the manufacturing process is different, so that the easiness of occurrence of a defect is different. As described in Japanese Patent Application Laid-Open 10-294345, when the inspection is executed using an inspection method and inspection device for irradiating a large-current electron beam to a board having a minute circuit pattern at high speed, obtaining an electron beam image by detecting a signal instantaneously, and comparing it with the neighboring equal pattern, to accomplish the above object of detecting a defect in high sensitivity under the optimum inspection condition respectively according to such various circuit patterns, the inspection method and inspection device of a circuit pattern relating to the present invention will be described hereunder.

To inspect a circuit pattern at high speed, it is necessary to irradiate a large-current electron beam once or several times, detect generated secondary electrons for an extremely short time, thereby form an electron beam image. When such a large-current electron beam is used, the electron beam on a sample will be a thick electron beam having a diameter of 50 nm to 100 nm or so compared with a diameter of 3 nm to 10 nm of a normal SEM. The examination of the inventor shows that than an electron beam image by the contour information of the shape obtained by a narrowly limited electron beam like the aforementioned normal SEM, an electron beam image of the contrast generated by the secondary electron generation efficiency of the material of a sample is more suited to detection of a defect. The secondary electron generation efficiency varies with the material of the lower layer and surface pattern forming the circuit pattern and the layer thickness, so that when an electron beam image having a large brightness contrast of the pattern and lower layer caused by this material is obtained, a defect of the pattern or lower layer can be easily detected. When an electron beam image is formed at high speed using such a thick large-current electron beam of about 50 nm to 100 nm in diameter, it is found that the image quality is different from that of a normal SEM. This difference will be described hereunder.

Firstly, when a small-current electron beam narrowly limited to 3 nm to 10 nm is slowly irradiated to a sample and a signal is detected for many hours, an electron beam image by the contour information of the shape is obtained on the other hand, when a thick electron beam of about 50 nm to 100 nm in diameter described in the prior art of Japanese Patent Application Laid-Open 10-294345 mentioned above is irradiated to a sample at high speed and an image is obtained instantaneously, an electron beam image of the contrast caused by the secondary electron generation efficiency of the material of the sample and the detection efficiency is obtained. As described already, since the electron beam diameter is larger than that of the SEM, how to see the shape contour is different from that of a normal SEM. Since an electron beam is scanned in a wide area at high speed, that is, the scanning width of the electron beam is wide, the magnification of an image, that is, the pixel size is different from that of a normal SEM. Furthermore, since a signal is detected at high speed immediately after the electron beam is irradiated and an image is formed, the charging state on the sample surface is different. Furthermore, since a constitution that a negative potential is applied to the sample and sample carrier is used, the potential state on the sample surface is different. As a result, when a large-current electron beam is scanned at high speed, and a signal is detected at high speed, and an image is formed, the inventor finds that an image quality different from that of a normal SEM is obtained.

The brightness of an electron beam image varies with the material of the uppermost surface of a circuit pattern to be inspected, pattern shape, and step. When an electron beam image is obtained under the same electron beam irradiation condition, it is found that no contrast is obtained depending on a combination of the materials of the pattern and lower layer and it is difficult to detect a defect from such an image. It is also found that the contrast is changed depending on the pattern step and shape. The secondary electron generation efficiency of each of the materials constituting the circuit pattern varies with the charging state. Therefore, when the charging condition under which the brightness contrast is increased by the materials of the surface pattern and lower layer is optimized by the materials, an electron beam image suited to detect respective defects in correspondence to a combination of various materials can be formed. To change the contrast, it is effective to change the charging state of a sample. However, when the scanning speed of an electron beam and the irradiation count to the same location are changed, for example, when the irradiation count to the same location is assumed as 8 times, the inspection time is increased to 8 times. Even when the scanning speed of an electron beam is changed, the inspection time is also adversely affected. When the electron beam current is reduced so as to narrowly limit the electron beam, the S/N ratio of an image is decreased and defect detection becomes difficult. As a method for changing the charging state without the inspection time being adversely affected, by changing the electron beam irradiation energy condition according to the material and shape of a circuit pattern to be inspected, step, and contents of a defect to be detected, it is found that the charging state of the sample surface is changed without the inspection time and S/N ratio of an electron beam image being adversely affected and the contrast suited to defect detection can be obtained. The contents of examination for realizing such an inspection will be described hereunder.

The first means realizes that by controlling and changing the electron beam irradiation energy and changing the sample charging state which varies with the material, even if the combination of materials is different, a brightness contrast is obtained. The control of the electron beam energy to be irradiated to a sample is made possible by the following means. A primary electron beam generated from the electron source is set to the desired acceleration voltage and the electron beam passes through the optical path at this acceleration voltage. When the acceleration voltage of the primary electron beam generated from the electron source is changed, the deflections of various lenses which are set midway in the optical path and the conditions of the electrode and coil current are all changed greatly and it is necessary to readjust the optical axis each time of changing.

When the irradiation energy is to be changed according to the shape and material of a circuit pattern to be inspected and a defect to be detected, the irradiation energy must be changed frequently and frequent great adjustment of the optical axis is troublesome, so that it is not desirable for keeping the optical conditions of the electron beam stable. Therefore, a constitution is used that by applying a negative potential to a sample or the sample carrier, the acceleration energy of the primary electron beam is reduced right above the sample and the electron beam is irradiated to the sample by the irradiation energy after deceleration. Since the degree of deceleration can be changed by variably controlling this negative applied voltage, the irradiation energy to a sample can be set optionally. Since the electron beam advances up to right above the sample at the fixed acceleration voltage, there is no need to greatly adjust the optical axis midway in the path and it is sufficient to finely adjust the effect of deceleration on the surface electric field.

The second means realizes that when the negative potential is to be applied to the sample or sample carrier by the first means, the adjustment of the lenses for focusing the voltage and current of the deflecting electrode and the electron beam on the sample in link motion with it is built as a data base as device parameters and other device parameters can be automatically set according to the voltage to be applied to the sample or sample carrier. By doing this, no optical axis adjustment is executed, and the parameters to be input by a user are minimized, and appropriate device conditions can be set automatically.

The third means decides the potential to be applied to a sample or sample carrier according to the material of the uppermost surface of a circuit pattern to be inspected. When there are a plurality of materials existing on the surface to be irradiated by an electron beam, the potential to be applied to the sample or sample carrier is decided by a combination of the materials. Although detailed conditions will be described in embodiments, for example, when a photosensitive resist is on a conductive layer, a conductor and an insulator are combined, so that an area having a comparatively low acceleration voltage where the potential contrast is discriminated is desirable. Since a photo resist is apt to be charged, the potential of 2 kV to 3 kV at which a photo resist is easily charged is not desirable. When a silicon oxide film and a silicon nitride layer are combined, both are insulating materials, so that unless the charging state is changed, no contract can be obtained. Therefore, in such a case, the potential of about 3 kV is desirable. As mentioned above, there is appropriated electron beam irradiation energy according to each of the materials. When these electron beam irradiation conditions are built as a data base in correspondence to a combination of materials and thee material kind and for example, recommendation conditions of the inspection mode having a photo resist are presented when the inspection conditions are set, appropriate inspection conditions can be set unless detailed conditions are searched for each circuit pattern to be inspected.

The fourth means decides the potential to be applied to a sample or sample carrier according to the kind of a defect to be detected on a circuit pattern to be inspected. When there are a plurality of kinds of defects to be detected, the potential to be applied to the sample or sample carrier is decided by a combination of the defects. Although detailed conditions will be described in embodiments, for example, when a non contact failure of: the contact hole connecting the board and capacitor is to be detected on a circuit pattern forming a transistor, the comparatively low potential of 1 kV or less suited to discrimination of the potential contrast is desirable.

However, when the step of a pattern to be inspected is large and a defect of the pattern shape generated in the step bottom is to be detected, the comparatively high potential of 3 kV or higher at which an electron beam can easily reach the step bottom is desirable. As mentioned above, the appropriate electron beam irradiation energy is different according to the kind of a defect to be detected. In the same way as with the third means, when these electron beam irradiation conditions are built as a data base and for example, the recommended value of the shape defect detection mode is presented, appropriate inspection conditions can be set easily without detailed inspection conditions being searched for each time.

The fifth means realizes searching of inspection conditions from the information of the aforementioned circuit pattern to be inspected when an inspection condition file is to be created from the operation screen. When an inspection condition file is to be created, conventionally, the arrangement of circuit patterns, the size of chips (die) in them, and the layout of the memory cell, peripheral circuit, and test pattern are input and the image processing conditions for deciding a defect are input. However, in addition to it, for example, selection of materials such as "photo resistmode", "linematerial (conductive layer material) mode", and "insulating material/insulating material mode", selection of "high step mode", "low step mode", and "no-step mode", and selection of the kind of a defect to be detected such as "potential contrast defect detection model", "shape defect detection mode", and "potential contrast/shape defect composite detection mode" are carried out from the menu on the screen, and the recommended value of the potential to be applied to a sample or sample carrier is presented by a combination of these selections, and the electron beam irradiation energy is decided from the beginning by the recommended value, and then various arrangements and the brightness of an image are adjusted and the defect decision conditions to be obtained from an image are decided, thereby an electron beam image is always formed under the electron beam irradiation condition most suitable for a pattern to be inspected and the defect inspection can be executed using the electron beam image. The recommended values for the aforementioned various patterns are obtained beforehand as device parameters, built as a data base in correspondence to the aforementioned inspection modes, and registered as one of the items of the inspection condition data base. The contents of various optimum conditions will be described in detail in embodiments.

By each of the means mentioned above, optimum electron beam irradiation energy can be set according to a circuit pattern to be inspected and a contrast which is stable and suited to the image process can be obtained. A means for detecting a defect generated on a circuit pattern from an electron beam image will be described hereunder. The first area of a sample is irradiated by a first electron beam, and secondary electrons generated from the sample surface are detected highly efficiently at high speed, and an electron beam image signal is obtained in the first area of a board to be inspected and stored in the first storage. In the same way, an electron beam image is obtained in the second area of the sample having an equal circuit pattern to that of the first area and stored in the second storage, and the detailed position adjustment is executed for the images in the first and second areas by the image processor, and then a differential image is obtained by comparing the images in the first and second areas, and a pixel that the absolute value of the brightness of the differential image is more than a certain predetermined threshold value is decided as a defect candidate. Under the same electron beam irradiation condition as the conventional one, a contrast may be obtained or may not be obtained depending on the kinds of a material and a defect. When no contrast is obtained, it is difficult to adjust the decision of defect detection and the difference in brightness cannot be extracted easily. Therefore, when a defect is extracted by the aforementioned means using an electron beam image having a large contrast always stably under the electron beam irradiation condition, a defect can be detected in higher sensitivity.

By executing the aforementioned inspection method, an inspection method and an inspection device for inspecting a circuit pattern on a board including various shapes, materials, and defects by an electron beam highly sensitively at high speed and automatically detecting a defect generated on the circuit pattern can be realized.

By the aforementioned various means, according to the detailed pattern shape and material of a wafer to be inspected, conditions of irradiation light and detection conditions thereof, image comparison conditions, defect decision conditions, and others are set respectively, and when these conditions are to be appropriately changed whenever the process conditions of a semiconductor device are changed, the recommended value of inspection condition corresponding to a circuit pattern to be inspected is registered as an inspection mode beforehand, and a user selects the condition corresponding to the circuit pattern to be inspected from the inspection mode, thereby optimum electron beam irradiation conditions can be set automatically, so that an inspection condition file can be simply input according to the predetermined procedure and the efficiency is improved.

Furthermore, in setting of the electron beam irradiation energy, the potential to be applied to a sample or a sample carrier and conditions of various lenses affected by it and of the deflection electrode are also set as device parameters in link motion, so that the user can set inspection conditions without setting various complicated parameters. Since it is sufficient only to change the irradiation energy to the sample, the inspection time and S/N ratio of an image will not be adversely affected.

As a result, to a semiconductor device for various products and steps, a highly precise inspection can be applied early and also the potential mistaking the contents and numerical value of an input parameter is reduced. As a result, even an operator who is not trained specially can set optimum inspection conditions simply. Therefore, using the aforementioned inspection method and device constitution, by obtaining an image of a circuit pattern and comparing and inspecting it, various device parameters for automatically detecting a defect generated on the pattern can be set simply.

Using th e method and device, by inspecting a board having a circuit pattern, for example, a semiconductor device in the manufacturing process, in a semiconductor device in each of the steps, a shape failure or defect of the pattern caused by the processing, which cannot be detected by the prior art, can be detected early and as a result, problems latent in the process or manufacturing device conditions can be discriminated. By doing this, the causes of failures in the manufacturing process of various boards such as a high-speed and highly precise semiconductor device compared with conventional devices can be removed and a high yield rate, that is, a high acceptance rate can be ensured and the maldetection generated during inspection which is questionable is reduced at the same time, so that a highly precise inspection can be executed. In a semiconductor device of various kinds of products and various kinds of steps, the setting of inspection parameters for which the prior art requires an extensive time can be executed efficiently in a short time and as a result, the desired appearance inspection can be applied early to the desired products and steps and the condition setting will not adversely affect processing completion of a wafer used for condition setting. As a result, details of a pattern shape failure caused by the processing and fine foreign substances can be confirmed early and the TAT from detection of an failure occurrence to a countermeasure can be shortened.

In the inspection method of the present invention, as a step of setting electron beam irradiation conditions according to a circuit pattern to be inspected, any or all of the electron beam irradiation energy to a sample, electron beam current, and electron beam irradiation count to the same area are set.

Furthermore, as a step of setting electron beam irradiation conditions according to a circuit pattern to be inspected, various inspection conditions including electron beam irradiation conditions are built, set, and stored as a data base beforehand and the inspection condition data base is read at the time of inspection execution.

The electron beam irradiation energy to a sample is set by a negative voltage applied to the sample and sample carrier.

The electron beam current is set by the voltage of the electrode and the current of the coil which are provided in the electronic optical system.

The electron beam irradiation conditions are set according to the material of a circuit pattern to be inspected, and the inspection conditions are set according to the pattern step of the circuit pattern to be inspected, and the electron beam irradiation conditions are set according to the pattern size and pattern shape of the circuit pattern to be inspected, and the electron beam irradiation conditions are set according to the kind of a defect to be detected on the circuit pattern to be inspected.

When the material of the surface of a circuit pattern to be inspected is a photosensitive resist, the electron beam irradiation energy is set within the range from 300 V to 3 kV, preferably from 1.5 kV to 3 kV after photo resist development, 1.5 kV to 3 kV after etching, or from 0.3 kV to 0.5 kV after conductive material filling.

When the surface material of a circuit pattern to be inspected is a combination of an insulating material and a conductive layer, the electron beam irradiation energy is set within the range from 300 V to 5 kV, preferably from 1 kV to 3 kV.

When the surface material of a circuit pattern to be inspected is a combination of an insulating material and a different insulating material, the electron beam irradiation energy is set within the range from 1.5 kV to 5 kV, preferably from 1.5 kV to 3 kV.

When the step of a circuit pattern to be inspected is 0.3 $\mu$m or more, the electron beam irradiation energy is set within the range from 1.5 kV to 5 kV, preferably in the neighborhood of 3 kV.

When the step of a circuit pattern to be inspected is less than 0.3 $\mu$m, the electron beam irradiation energy is set within the range from 300 V to 3 kV, preferably within the range from 0.5 kV to 0.8 kV.

When the kind of a defect to be detected on a circuit pattern to be inspected is a non-conduction failure of the contact hole, the electron beam irradiation energy is set within the range from 300 V to 3 kV, preferably within the range from 0.5 kV to 0.8 kV.

When the kind of a defect to be detected on a circuit pattern to be inspected is a short failure of the transistors or lines, the electron beam irradiation energy is set within the range from 300 V to 3 kV, preferably within the range from 0.5 kV to 0.8 kV.

When the kind of a defect to be detected on a circuit pattern to be inspected is a pattern shape failure, the electron beam irradiation energy is set within the range from 1 kV to 5 kV, preferably within the range from 1 kV to 3 kV.

When the kind of a defect to be detected on a circuit pattern to be inspected is thin film remains, the electron beam irradiation energy is set within the range from 300 V to 3 kV, preferably in the neighborhood of 0.5 kV.

When the kind of a defect to be detected on a circuit pattern to be inspected is all of a contact hole failure, a shot failure of the transistors or lines, and a pattern shape failure, the electron beam irradiation energy is set within the range from 1 kV to 5 kV, preferably within the range from 1 kV to 3 kV.

When the pattern shape of a circuit pattern to be inspected is a contact hole and the step that the inside of the hole is filled with a conductor is to be inspected, the electron beam irradiation energy is set within the range from 300 V to 3 kV.

When the pattern shape of a circuit pattern to be inspected is a contact hole and the step that the inside of the hole is not filled, the electron beam irradiation energy is set within the range from 800 V to 5 kV.

BRIEF DESCRIPTION OF THE DRAWINGS

FIG. 3 is a plan view for explaining a semiconductor device circuit pattern and failure contents.

FIG. 6 is a drawing showing appropriate electron beam irradiation conditions according to a semiconductor device circuit pattern.

DETAILED DESCRIPTION OF THE PREFERRED EMBODIMENT

An example of the inspection method and device of the embodiments of the present invention will be explained in detail hereunder with reference to the accompanying drawings.

Figure 1:
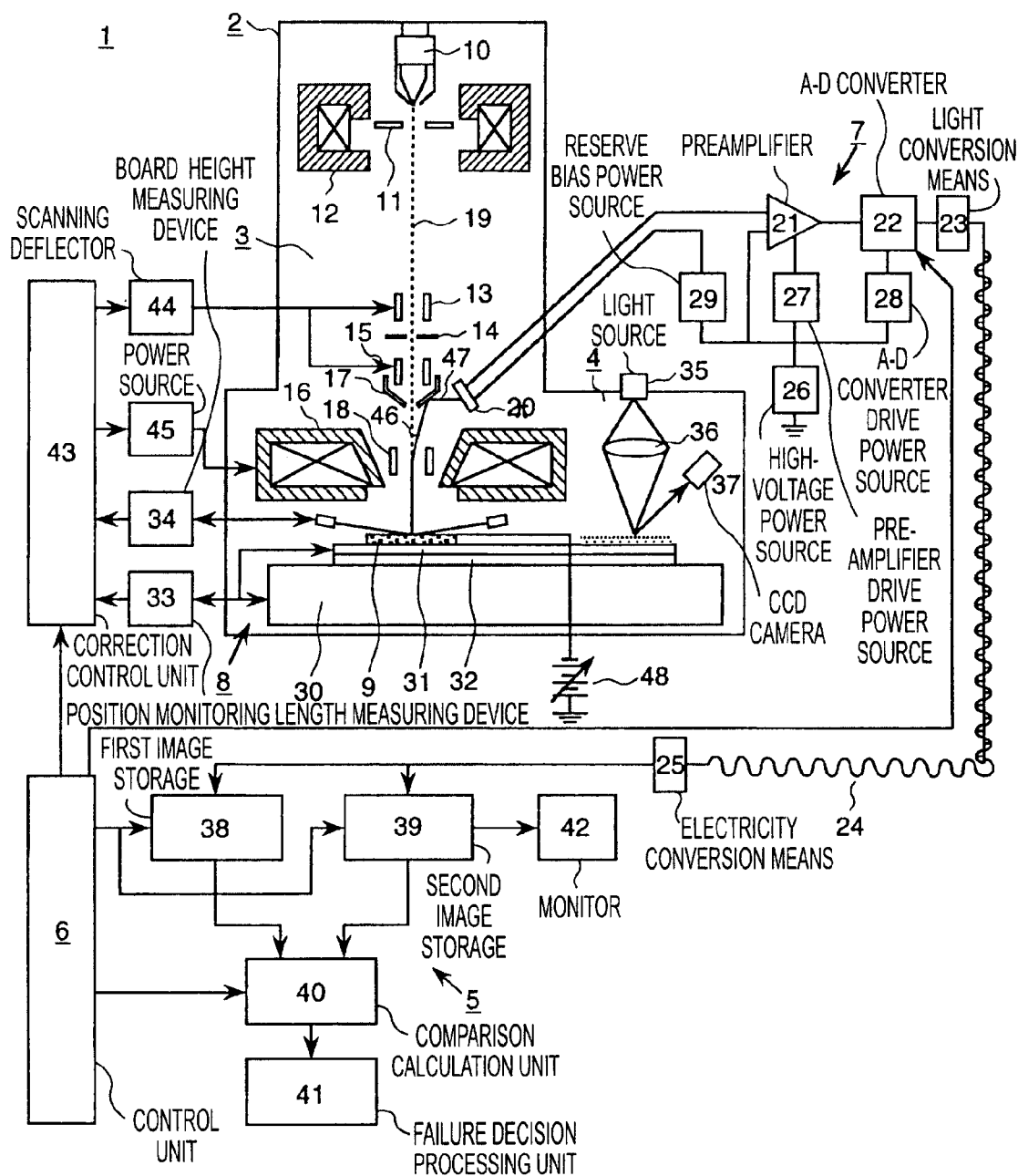
FIG. 1 is a drawing showing the constitution of a circuit pattern inspection device.

The constitution of a circuit pattern inspection device 1 in one embodiment is shown in FIG. 1. The circuit pattern inspection device 1 has an inspection chamber 2 which is evacuated and a preliminary chamber (not shown in the drawing in this embodiment) for transferring a sample board 9 into the inspection chamber 2 and the preliminary chamber is structured so as to be evacuated independently of the inspection chamber 2. In addition to the aforementioned inspection chamber 2 and preliminary chamber, the circuit pattern inspection device 1 is composed of a control unit 6 and an image processing unit 5. The inside of the inspection chamber 2 is broadly composed of an electronic optical system 3, a secondary electron detection unit 7, a sample chamber 8, and an optical microscope unit 4. The electronic optical system 3 is composed of an electron gun 10, an electron beam leading electrode 11, a capacitor lens 12, a blanking deflector 13, a scanning deflector 15, a limiting device 14, an object lens 16, a reflection plate 17, and an ExB deflector 18. A secondary electron detector 20 of the secondary electron detection unit 7 is arranged above the object lens 16 in the inspection chamber 2. An output signal of the secondary electron detector 20 is amplified by a preamplifier 21 installed outside the inspection chamber 2 and converted to digital data by an A-D converter 22. The sample chamber 8 is composed of a sample carrier 30, an X stage 31, a Y stage 32, a position monitoring length measuring device 33, and a board height measuring device 34. The optical microscope unit 4 is installed in the neighborhood of but away from the electronic optical system 3 in the inspection chamber 2 so that they are not adversely affected from each other and the distance between the electronic optical system 3 and the optical microscope unit 4 is already known. The X stage 31 and the Y stage 32 move back and forth at the known distance between the electronic optical system 3 and the optical microscope unit 4. The optical microscope unit 4 is composed of a light source 35, an optical lens 36, and a CCD camera 37. The light source 35 and the CCD cameral 37 may be structured so as to be installed outside the evacuated inspection chamber 2. The image processing unit 5 is composed of a first image storage 38, a second image storage 39, a comparison calculation unit 40, and a failure decision processing unit 41. By using a monitor 42, electron beam images read into the image storages 38 and 39, an electron beam image obtained in the work memory in real time, an optical image exposed by the CCD camera 37, and a differential image after the comparison process by the comparison calculation unit 40 can be optionally selected and displayed. An operation instruction and operation conditions of each of the units of the device are input or output from the control unit 6. In the control unit 6, conditions such as the acceleration voltage, electron beam deflection width, and deflection speed for generation of an electron beam, signal reading timing of the secondary electron detection device, and sample carrier moving speed are input beforehand so as to be set optionally or selectively according to the purpose. The control unit 6 monitors displacements of position and height from signals of:the position monitoring length measuring device 33 and the board height measuring device 34 using a correction control circuit 43, generates a correction signal from the results thereof, and sends the correction signal to a power source 45 of the object lens and a scanning deflector 44 so that the electron beam is always irradiated to the correct position.

To obtain an image of the board to be inspected 9, when an electron beam 19 which is narrowly limited is irradiated to the board to be inspected 9, and secondary electrons 46 are generated, and they are detected in synchronization with scanning of the electron beam 19 and movement of the X and Y stages 31 and 32, an electron beam image is obtained on the surface of the board to be inspected 9. The circuit pattern inspection device of this embodiment is structured so as to form an electron beam image by detecting a signal for scanning an electron beam of a large current about 100 times or more of that of a normal SEM, for example., 100 nA only once. The scanning width is set to 100 $\mu$m, and 1 pixel is set to 0.1 $\mu$m$^2$, and the time of one scanning is set to 1 $\mu$s.

For the electron gun 10, a diffusion replenishment type thermal electric field emission electron source is used. When this electron gun 10 is used, a stable electron beam current can be ensured compared with, for example, a conventional tungsten (W) filament electron source or a cold electric field emission type electron source, so that an electron beam image with little brightness variation can be obtained and furthermore the electron beam current; can be set to a large value. Therefore, by one scanning, an electron beam image with a high S/N ratio can be formed and a high-speed inspection can be realized. The electron beam 19 can be drawn from the electron gun 10 by applying a voltage between the electron gun 10 and the leading electrode 11. The electron beam 19 is accelerated by applying a negative potential at a high voltage to the electron gun 10. By doing this, the electron beam 19 moves toward the sample carrier 30 with the energy equivalent to the potential, is focused by the capacitor lens 12, furthermore narrowly limited by the object lens 16, and irradiated to the board to be inspected 9 (semiconductor wafer, chip, or liquid crystal, board having a minute circuit pattern such as a mask) loaded on the X and Y stages 31 and 32 on the sample carrier 30. To the blanking deflector 13, the signal generator 44 for generating a scanning signal and a blanking signal is connected and to the capacitor lens 12 and the object lens 16, the lens power source 45 is connected respectively. To the board to be inspected 9, a negative voltage can be applied from a high-voltage power source 48. By adjusting the voltage of the high-voltage power source 48, the primary electron beam is decelerated and the electron beam irradiation energy to the board to be inspected 9 can be adjusted to an optimum value without changing the potential of the electron gun 10.

The secondary electrons 46 generated by irradiating the electron beam 19 onto the board to be inspected 9 are accelerated by a negative voltage applied to the board 9. Above the board to be inspected 9, the ExB deflector 18 is arranged and the secondary electrons 46 accelerated by it are deflected in the predetermined direction. By the voltage to be applied to the ExB deflector 18 and the magnetic field intensity, the deflection amount can be adjusted. The electromagnetic field can be changed in connection with a negative voltage applied to the sample. The secondary electrons 46 deflected by the ExB deflector 18 collide with the reflection plate 17 under the predetermined condition. When the accelerated secondary electrons 46 collide with this reflection plate 17, second secondary electrons 47 having energy of several V to 50 eV are generated from the reflection plate 17.

The secondary electron detection unit 7 is composed of the secondary electron detector 20 installed in the evacuated inspection chamber 2 and the preamplifier 21, the A-D converter 22, a light conversion means 23, a transmission means 24, an electricity conversion means 25, a high-voltage power source 26, a preamplifier drive power source 27, an A-D converter drive power source 28, and a reverse bias power source 29 which are installed outside the inspection chamber 2. As described already, among the secondary electron detection unit 7, the secondary electron detector 20 is arranged above the object lens 16 in the inspection chamber 2. The secondary electron detector 20, the preamplifier 21, the A-D converter 22, the light conversion means 23, the preamplifier drive power source 27, and the A-D converter drive power source 28 are floated at a positive potential by the high-voltage power source 26. The second secondary electrons 47 generated by the collision with the reflection plate 17 are led to the detector 20 by the attraction electric field. The secondary electron detector 20 is structured so as to detect the secondary electrons 47 generated when the secondary electrons 46 generated while the electron beam 19 is irradiated to the board to be inspected 9 are accelerated thereafter and collide with the reflection plate 17 in connection with the scanning timing of the electron beam 19. An output signal of the secondary electron detector 20 is amplified by the preamplifier 21 installed outside the inspection chamber 2 and converted to digital data by the A-D converter 22. The A-D converter 22 is structured so as to convert an analog signal detected by the semiconductor detector 20 to a digital signal immediately after it is amplified by the preamplifier 21 and transmit it to the image processing unit 5. The A-D converter 22 digitizes and transmits the detected analog signal immediately after detection, so that a signal which is faster than that of a conventional device and has a high S/N ratio can be obtained.

The board to be inspected 9 is loaded on the X and Y stages 31 and 32 and any of the method for stopping the X and Y stages 31 and 32 at the time of inspection execution and scanning the electron beam 19 two-dimensionally and the method for moving the X and Y stages 31 and 32 in the direction of Y continuously at the fixed speed at the time of inspection execution and linearly scanning the electron beam 19 in the direction of X can be selected. When a specific comparatively small area is to be inspected, the former inspection method for stopping the stages is effective and when a comparatively wide area is to be inspected, the inspection method for moving the stages continuously at the fixed speed is effective. When it is necessary to blank the electron beam 19, the electron beam 19 is deflected by the blanking deflector 13 and can be controlled so as to prevent from passing through the limiting device 14. By doing this, an electron beam which is not necessary for inspection is controlled so as to prevent from irradiating the sample and the board to be inspected 9 can be suppressed from charging.

As the position monitoring length measuring device 33, a length measuring meter by laser interference is used in this embodiment. The positions of the X stage 31 and the Y stage 32 can be monitored in real time and are transferred to the control unit 6. Various data of the X stage 31 and the Y stage 32 are also structured to be transferred to the control unit 6 from respective drivers. The control unit 6 is designed to correctly confirm the area and position where the electron beam 19 is irradiated on the basis of these data and when necessary, the displacement of the irradiation position of the electron beam 19 can be corrected by the correction control circuit 43 in real time. For each board to be inspected, the area where the electron beam is irradiated can be stored.

For the optical height measuring device 34, an optical measuring device which is a measuring system by other than an electron beam, for example, a laser interference measuring device or a reflected light type measuring device for measuring a change by the position of the reflected light is used and the height of the board to be inspected 9 loaded on the X and Y stages 31 and 32 is structured so as to be measured in real time. In this embodiment, a system that long and narrow white light passing through the slit is irradiated to the board to be inspected 9 through the transparent window, and the position of the reflected light is detected by the position detection monitor, and the change amount of height is calculated from the change of position is used. On the basis of the measured data of the optical height measuring device 34, the focal length of the object lens 16 for narrowly limiting the electron beam 19 is corrected dynamically and the electron beam 19 which is focused on the area not to be inspected can be irradiated always. The warp and height distortion of the board to be inspected 9 are measured beforehand before irradiation of the electron beam and it can be structured so as to set the correction conditions for each inspection area of the object lens 16 on the basis of the data.

The image processing unit 5 is composed of the first image storage 38, the second image storage 39, the comparison calculation unit 40, the failure decision processing unit 41, and the monitor 42. An image signal of the board to be inspected 9 detected by the secondary electron detector 20 is amplified by the preamplifier 21, digitized by the A-D converter 22, converted to an optical signal by the light converter 23, transferred by the optical fiber 24, converted to an electric signal once again by the electricity converter 25, and then stored in the first image storage 38 or the second storage 39 by an instruction from the control unit 6. The image signal stored in these two storages by the instruction from the control unit 6 is sent to the comparison calculation unit 40 and the comparison calculation unit 40 performs various image processes for positioning, standardization of the signal level, and removal of a noise signal and compares and calculates image signals of the storages. The failure decision processing unit 41 compares the absolute value of the differential image signal, compared and calculated by the comparison calculation unit 40, with the predetermined threshold value. When the differential image signal level for a pixel is higher than the predetermined threshold value, decides the pixel is decided as a failure candidate. The monitor 42 displays the positions which are decided as failures by the failure decision processing unit 41 in real time during inspection by an instruction from the control unit 6 and the total number of detected failures and displays the image data stored in the first storage 38 or the second storage 39.

Figure 2A:
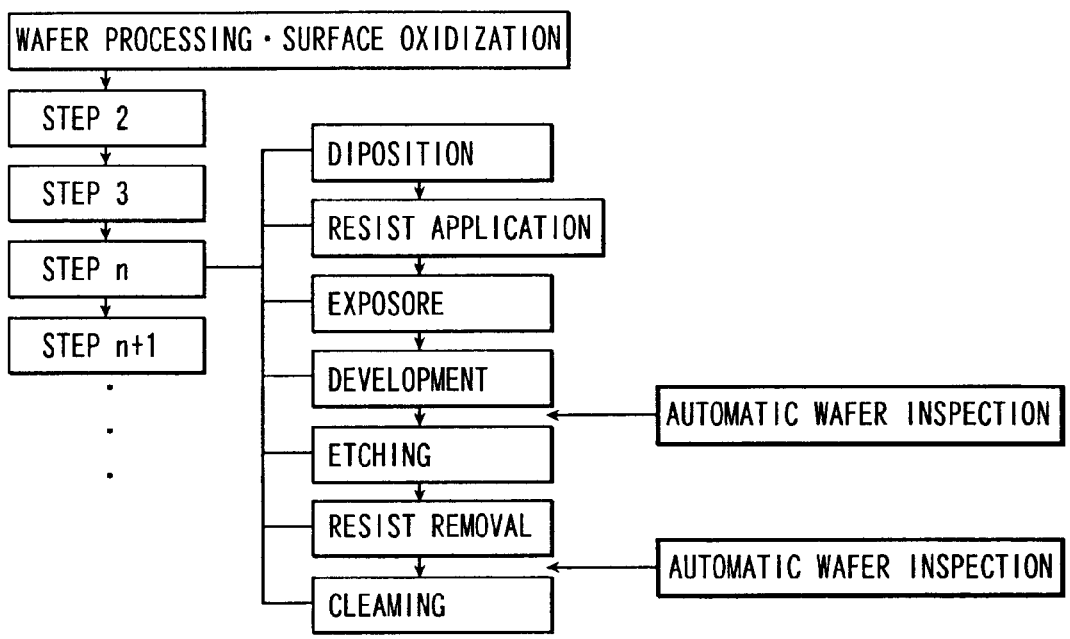
FIGS. 2(a–b) is a drawing for explaining the flow of the semiconductor device manufacturing process.
Figure 2B:
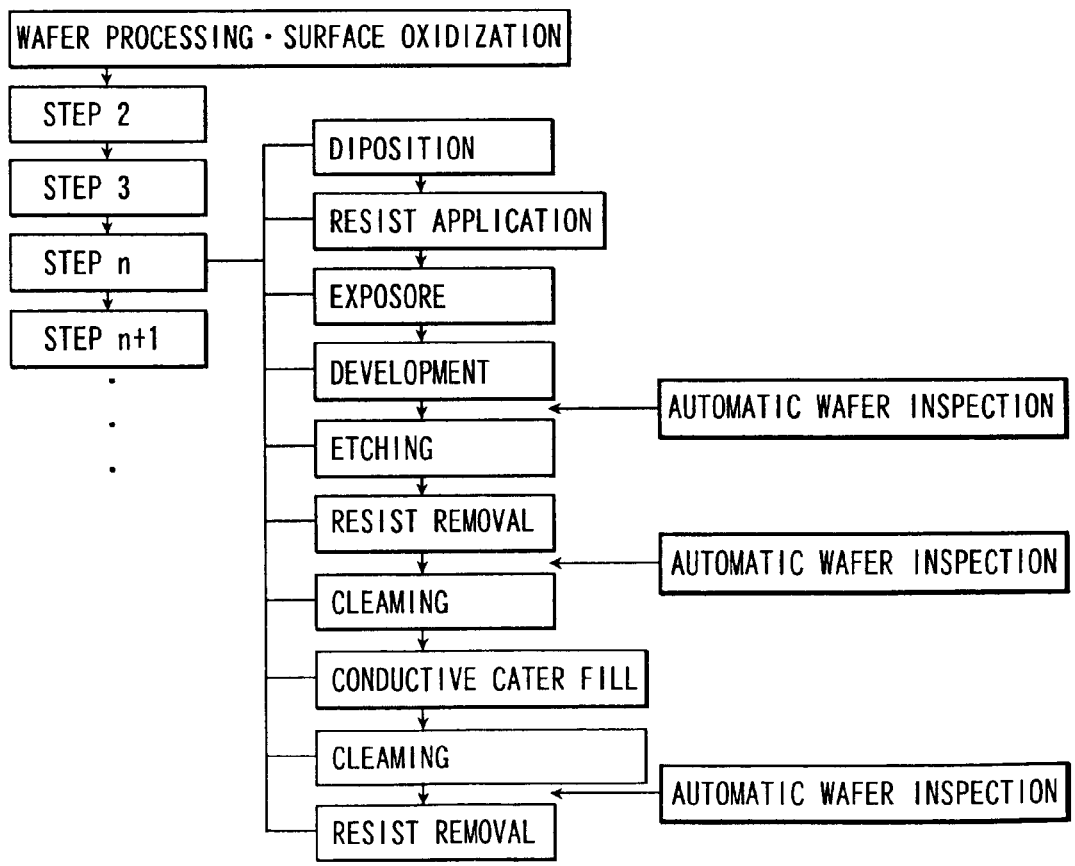
Figure 4A:
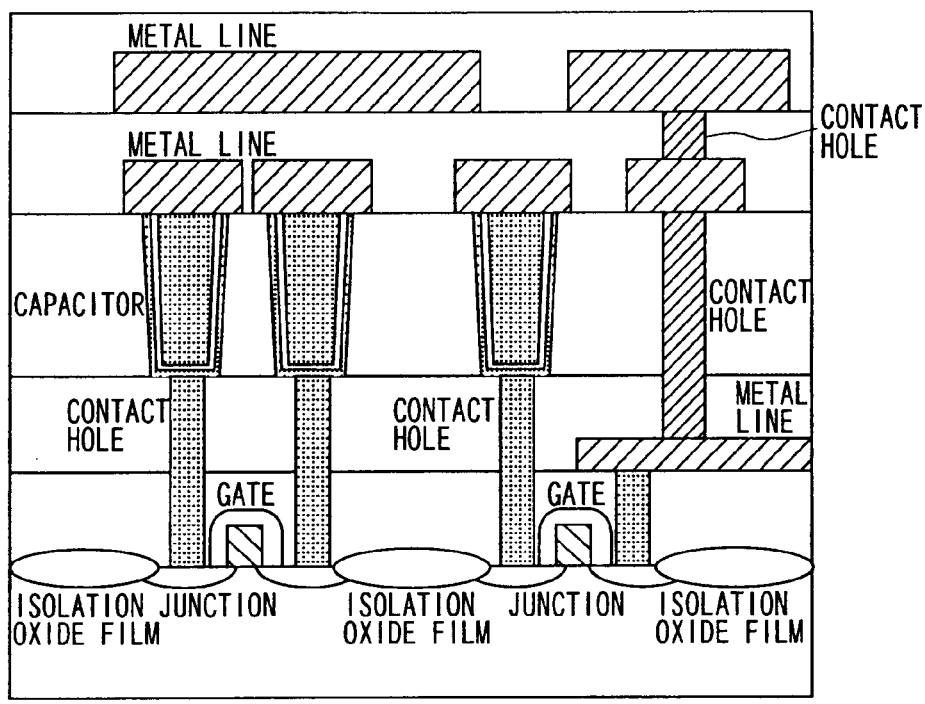
FIG. 4 is a cross sectional view for explaining a semiconductor device circuit pattern and failure contents.
Figure 4B:
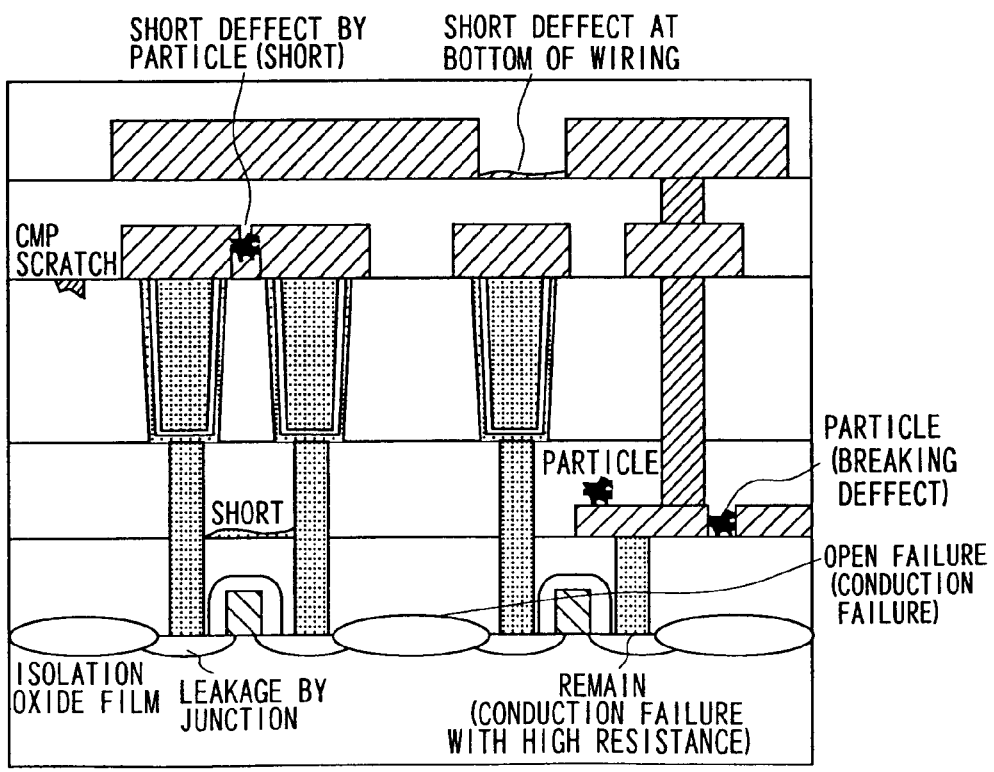

The whole constitution of the circuit pattern inspection unit 1 is explained above. Next, the manufacturing process of a circuit pattern to be inspected and details of a failure generated will be explained. In this embodiment, an example of a semiconductor wafer will be explained. FIG. 2 shows a manufacturing process of a semiconductor device. As shown in FIG. 2(*a*), the semiconductor device repeats forming of many patterns. The pattern forming process is broadly composed of the steps of deposition, photo resist application, exposure, development, etching, resist removal, and cleaning. As shown in FIG. 2(*b*), the steps of filling deposition, surface grinding, and cleaning may be added. FIG. 2(*b*) shows the process mainly used at the hole forming step and line forming step. When the manufacturing conditions for processing are not optimized at each of the steps, a circuit pattern of the semiconductor device is not normally formed on the board wafer and a defective product which does not operate normally is formed. To detect an occurrence of a failure early at the manufacturing steps, confirm the contents of the failure, and optimize the manufacturing conditions., it is necessary to execute the inspection with high precision at each step. An example of the steps of execution of the inspection is shown in FIGS. 2(*a*) and 2(*b*). In FIGS. 3(*a*) and 3(*b*) and FIGS. 4(*a*) and 4(*b*), the outline of a circuit pattern formed on a semiconductor wafer in the manufacturing process and, the contents of a failure generated are shown. FIG. 3(*a*) is a plan view of a normally processed circuit pattern and FIG. 3(*b*) is a plan view of a circuit pattern in which a failure is generated. For example, when a failure is generated in the deposition process shown in FIG. 2, particles are generated, adhered to the surface, and converted to an isolated defect shown in FIG. 3(*b*). When the exposure conditions during exposure to light, for example, the focus and exposure time are not optimum, "shorte", "open wiring" or "narrow pattern" shown in FIG. 3(*b*) may be caused. When there is a failure in the mask or reticle during exposure to light, the same pattern failure is generated in the same position in the shot for each shot which is an exposure unit. When the etching conditions are not optimum, a conduction failure of the hole pattern is generated and the pattern size is not formed as specified by the design value. When the etching conditions are not optimum, particles are generated, and a location which is not etched due to the particles is generated, and a pattern short or an isolated failure is caused. In the cleaning process, particles are adhered to the wafer surface due to contaminants of the liquid in the cleaning bath or readhesion of peeled thin films or foreign substances, or oxide films are locally generated due to the water drip conditions during cleaning or drying, or uneven layer thicknesses are easily generated. Furthermore, in the filling grinding process, abrasives remain and scratches due to grinding are easily generated. As mentioned above, a failure generated at one step is shown in: FIG. 3 and in FIGS. 4(*a*) and 4(*b*), failures which may be generated at the whole steps for manufacturing a semiconductor device are shown in cross sectional views. FIG. 4(*a*) is a schematic view of the section of a circuit pattern normally formed and FIG. 4(*b*) is a schematic view of the section of a circuit pattern in which a failure is generated. At the element isolation step necessary for forming transistors, it is necessary that the board and transistors are in contact with each other and in the transistors, a current flows by signals from the gate electrode and lines by the junctions which are isolated from each other. However, when a conduction failure is caused to the hole pattern connecting the transistors and board, or the lines are short-circuited with each other, or the transistors are connected to each other due to a short defect, the device will not operate normally.

As mentioned above, at each of the manufacturing steps of a semiconductor device, as shown in FIGS. 2, 3, and 4, there are layers of various materials and there are also various steps and shapes. The operation when such a circuit pattern to be inspected is inspected by the inspection device 1 explained in FIG. 1 will be explained hereunder. When the primary electron beam 19 enters the solid, it excites intra-shell electrons at each depth as it advances inside and loses energy. In addition, a phenomenon that reflected electrons generated by backward scattering of the primary electron beam advance toward the surface also by exciting electrons in the solid is generated. Through these plurality of processes, intra-shell electrons become secondary electrons across the surface barrier from the solid surface and move into the vacuum with energy of several eV to 50 eV provided. As the angle between the primary electron beam and the solid surface decreases, the ratio of the entry distance of the primary electron beam to the distance from the position thereof to the solid surface decreases and secondary electrons are easily emitted from the surface. Therefore, the generation of secondary electrons depends on the angle between the primary electron beam and the solid surface and the secondary electron generation amount becomes information indicating irregularities of the sample surface and the material. The secondary electron generation efficiency varies with the material, so that the contrast is adversely affected greatly.

Figure 5A:
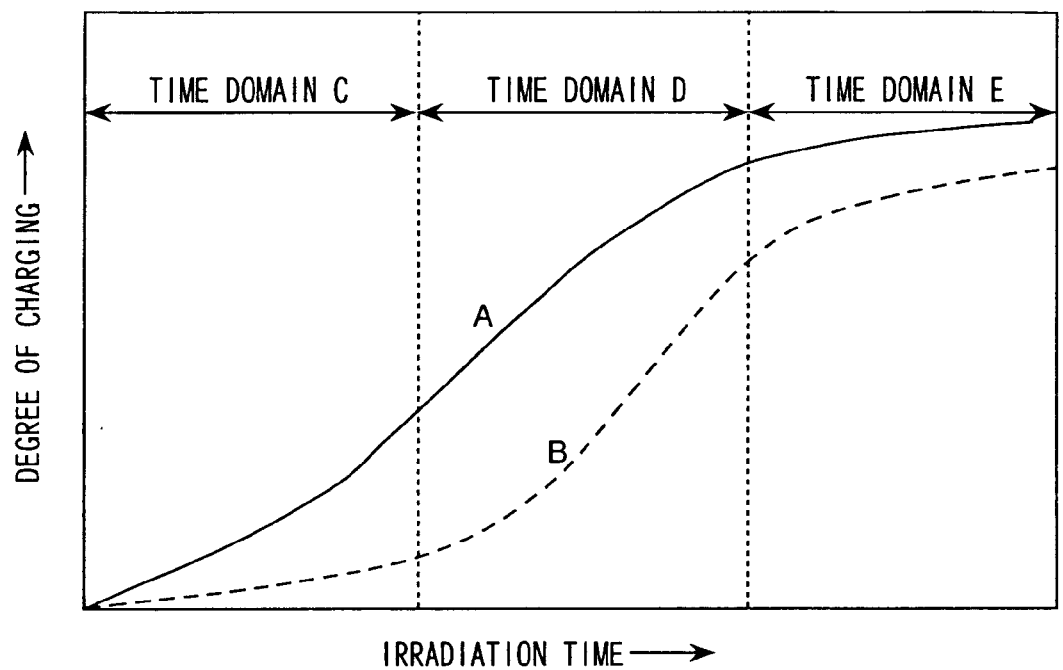
FIG. 5 is a drawing for explaining the effect of electron beam irradiation conditions on the contrast.
Figure 5B:
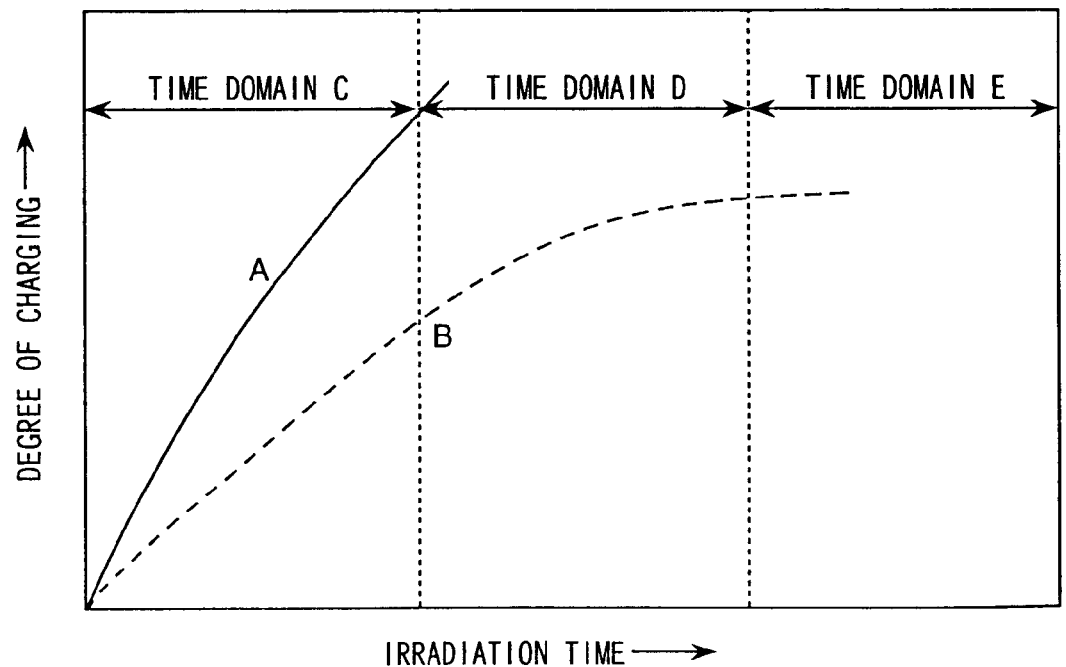

The contrast of an electron beam image is formed by the amount of secondary electrons generated and detected by an electron beam irradiated to a sample. The irradiation conditions adversely affecting the contrast of an electron beam image will be described hereunder. FIGS. 5(a) and 5(b) are graphs showing the effect of the electron beam irradiation energy on the contrast, and FIG. 5(a) shows a case that the irradiation energy is appropriate, and FIG. 5(b) shows a case that the irradiation energy is in appropriate. The vertical axis indicates the degree of charging whose mutual relation with the brightness of an image is large and the horizontal axis indicates the irradiation time of an electron beam. The solid lines A indicate a case that a photo resist is used as a sample and the dashed lines B indicate a case that the line material is used as a sample.

FIG. 5(a) shows that in the time domain C where the irradiation time is short, the change in brightness of each material is little, and in the time domain D where the irradiation time is comparatively long, the change in brightness due to the irradiation time is great, and in the time domain E where the irradiation time is long finally, the change in brightness due to the irradiation time is little again. FIG. 5(b) shows that when the irradiation conditions are not appropriate, even in the time domain C where the irradiation time is short, the change in brightness due to the irradiation time is great and it is difficult to obtain a stable image. Therefore, to obtain a stable electron beam image at high speed by this material, it is necessary to obtain an image under the irradiation condition shown in FIG. 5(a).

The inspection device 1 of this embodiment detects a secondary electron signal immediately after the electron beam is irradiated and forms an electron beam image, so that the signal difference in the time domain C shown in FIG. 5 becomes the contrast between the circuit pattern and the lower layer at the time of inspection. With respect to the irradiation conditions of the electron beam to a sample, the electron beam current, electron beam scanning speed, irradiation energy of the electron beam to be irradiated to a sample, and irradiation count of the electron beam to the same location may be cited. Among them, when the electron beam scanning speed and irradiation count are increased, the inspection time is prolonged. When the electron beam current is reduced below the predetermined S/N ratio, it is difficult to automatically detect the existence of a failure by the image process from an electron beam image. Therefore, in this embodiment, conditions are set by a method for freely adjusting and controlling the irradiation energy of the electron beam to be irradiated to a sample among these parameters and changing the charging state, thereby adjusting the contrast. To adjust the electron beam irradiation energy to a sample, the device is structured so as to apply a negative voltage for decelerating the primary electrons to the semiconductor wafer 9 which is a sample by the high-voltage power source 48 and adjust the irradiation energy of the electron beam 19 when necessary by adjusting this voltage. By doing this, when the acceleration voltage to be applied to the electron gun 10 is to be changed, an axial change of the electron beam 19 is generated and various adjustments are required, while this embodiment does not execute those adjustments and can obtain the same effects. Therefore, the inventor evaluates the electron beam irradiation energy for increasing the contrast in the time domain C by adjusting the negative voltage to be applied to the semiconductor wafer 9 which is the aforementioned sample for various semiconductor circuit patterns and obtains optimum conditions.

Figure 7:
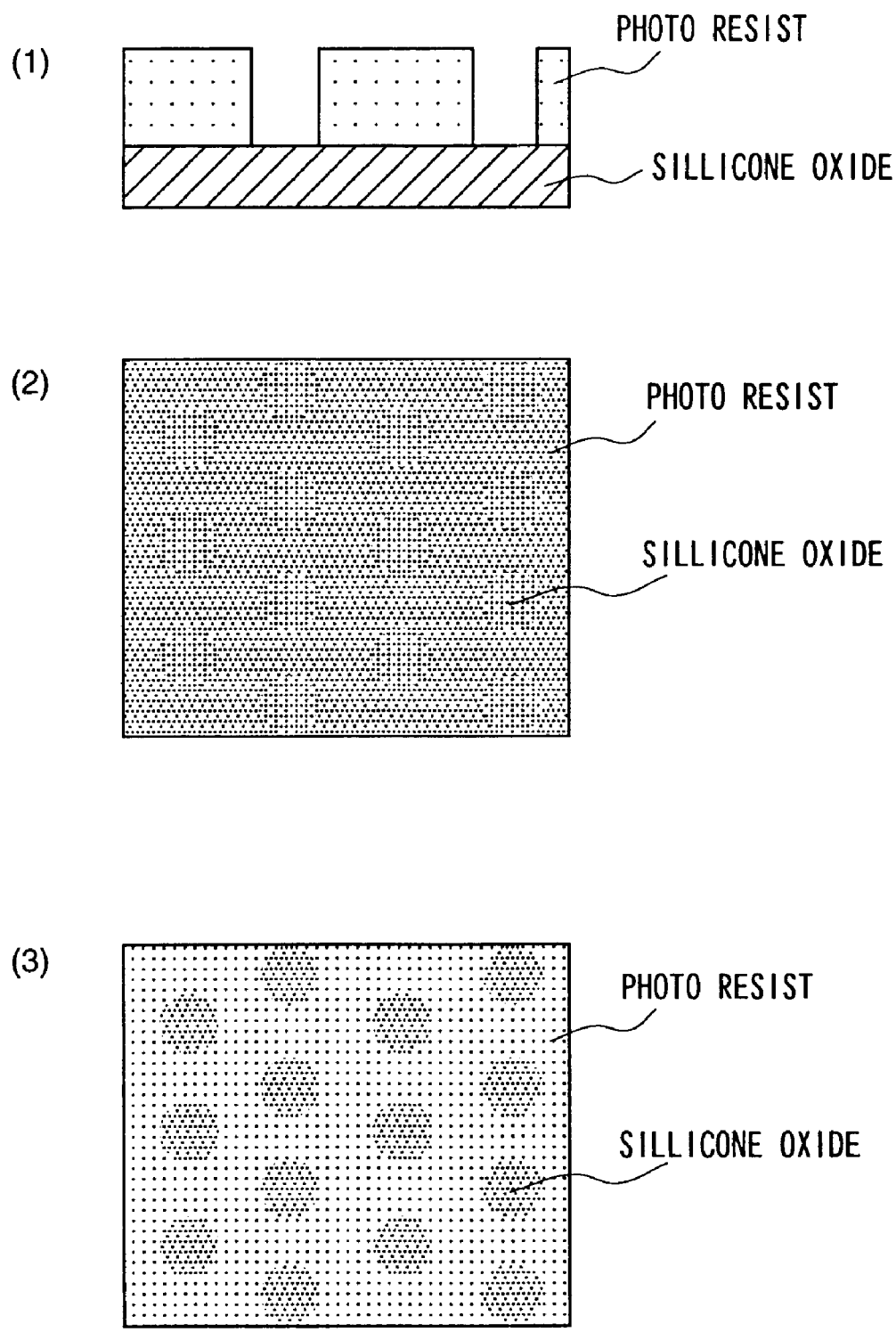
FIG. 7 is a drawing showing image characteristics in the hole forming process (after photo resist application).
Figure 8:
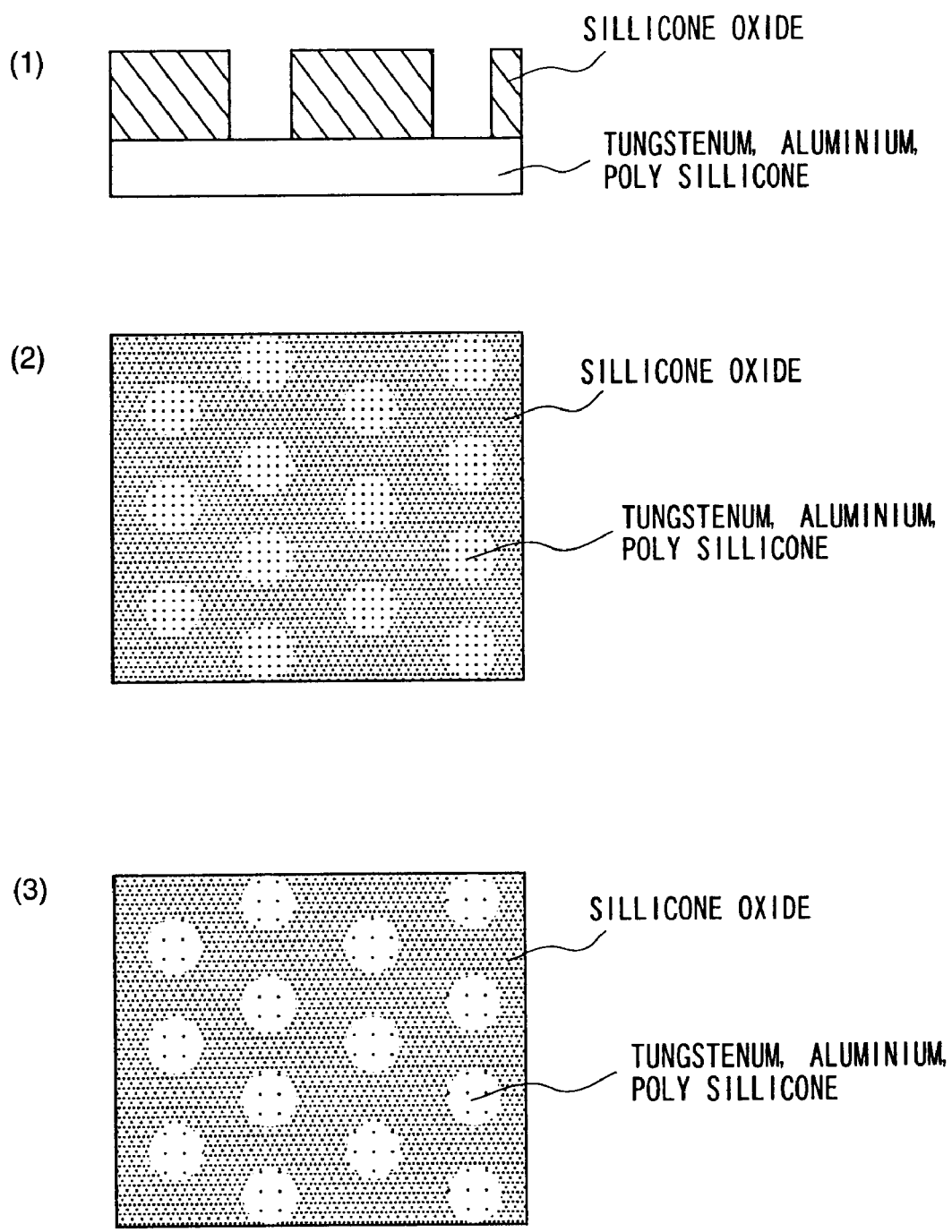
FIG. 8 is a drawing showing image characteristics in the hole forming process (after etching).
Figure 9:
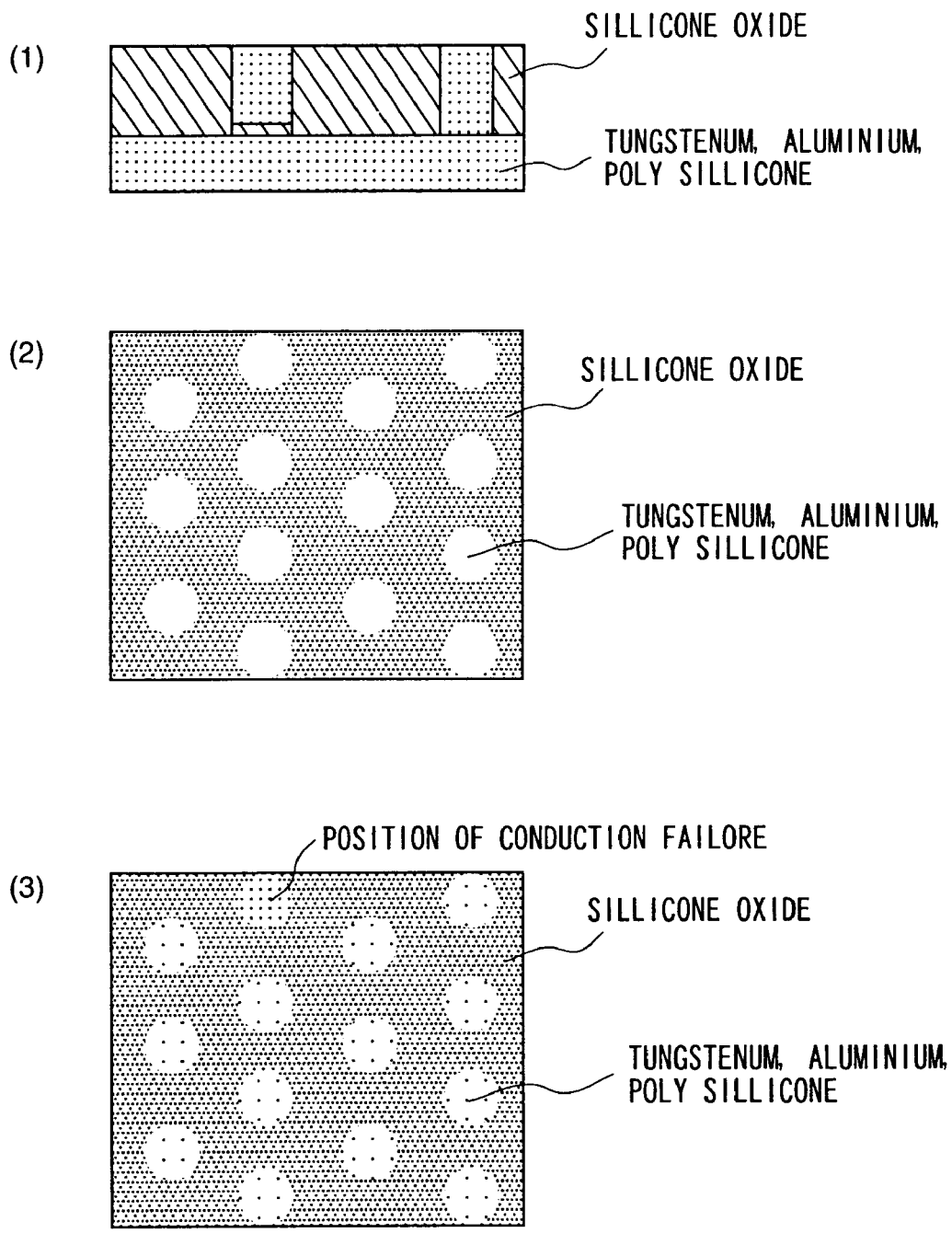
FIG. 9 is a drawing showing image characteristics in the hole forming process (after filling).

FIG. 6 shows a list of conditions of electron beam irradiation energy by the material and step of a circuit pattern to be inspected and a list of conditions of electron beam irradiation energy by the kind of a failure to be detected. In this embodiment, the acceleration voltage of the electron beam of the inspection device 1 is set to 10 kV. In FIG. 6, with respect to the information of a semiconductor wafer to be inspected, that is, the patterning process, step, and kind of a defect to be detected, the classification, description, material, etc., appropriate irradiation energy range, and most suitable value of irradiation energy are shown. Therefore, for example, when negative voltages to be applied to a sample and a sample carrier are set to −9 kV, the energy of an electron beam to be irradiated to the sample is 1 kV. For example, in the hole forming process, a hole is formed so as to connect the transistors or lines of the lower layer and the transistors or lines of the upper layer. Therefore, in a manufacturing method that for example, a silicon oxide film is formed, and a hole pattern is formed in the desired location by a photo resist pattern, etched on a mask, conducted to the lower layer, and filled with a conductive material after removal of the resist, and the surface is polished and flattened, after photo resist development (see FIG. 7(1)), a combination of the photo resist on the uppermost surface and the silicon oxide film on the lower layer is obtained. In this case, when an electron beam with irradiation energy of 500 V or less is irradiated, since both materials are an insulator material, similar dark contrasts are obtained, and the pattern shape cannot be recognized, and detection of a failure is difficult (see FIG. 7(2)). Therefore, when an electron beam is irradiated so as to provide irradiation energy of 3 kV as a condition of easy charging, the photo resist is made brighter and the silicon oxide film is made darker compared with it, so that a contrast is generated and a failure can be detected easily (FIG. 7(3)). In another example, after etching in the hole forming process (see FIG. 8(1)), a combination of the silicon oxide film on the uppermost surface and the conductor on the lower layer, for example, tungsten or polysilicone is obtained. However, when the hole diameter is small and the hole depth is deep and when an electron beam with irradiation energy of 500 V or less is irradiated, the electron beam reaches the hole bottom and no secondary electrons will be generated (FIG. 8(2)). In such a case, to allow the electron beam to reach the hole bottom and obtain a secondary electron signal, it is necessary to set the irradiation energy to 1 kV or more, preferably to about 3 kV (FIG. 8(3)). In still another example, in the hole forming process that a hole is formed and then filled with a conductor and the surface is flattened (FIG. 9(1)), the filled conductor and the transistors or lines on the lower layer are conducted to each other, so that as a combination of materials, a conductor and an insulator may be cited. Since the surface is flat, even if the electron beam irradiation energy is not particularly made higher, the electron beam can be irradiated to respective locations. As a result, an electron beam irradiation condition of 300 V or more provides no trouble.

Generally, in such a process, it is questionable whether the conductor filled in the hole and the transistors or lines on the lower layer are conducted to each other. In such a case, a condition of low irradiation energy which can emphasize the potential contrast is desirable. When the irradiation energy is set to 3 kV or less, preferably to 1 kV or less, a conduction failure can be detected in high sensitivity (FIG. 9(2)). When the irradiation energy is set to, for example, 5 kV or more for such a sample, the hole pattern shape can be seen but a conduction failure cannot be detected as a failure because there is no contrast difference from the normal area (FIG. 9(3)).

Figure 10:
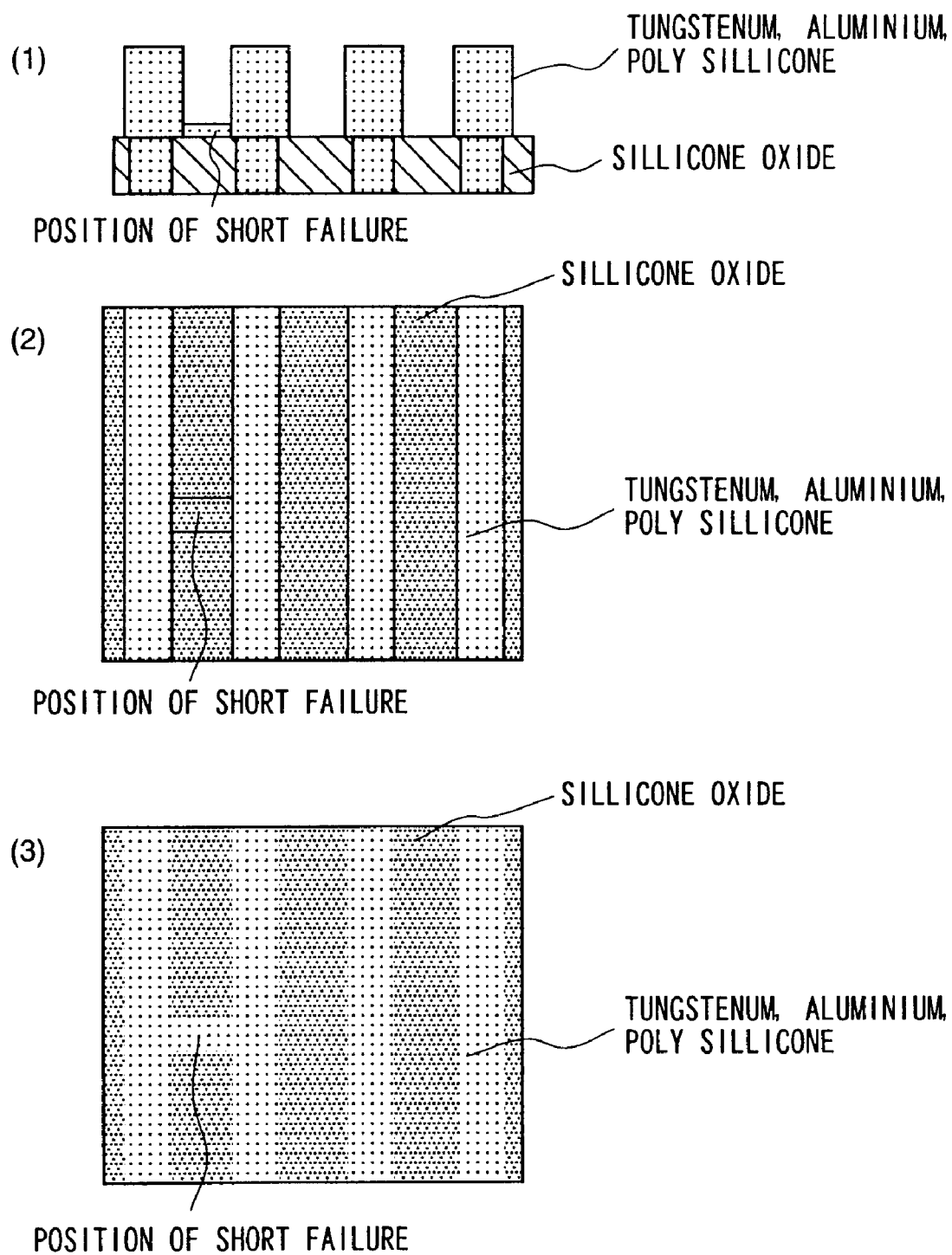
FIG. 10 is a drawing showing image characteristics in the line forming process (after etching).
Figure 11:
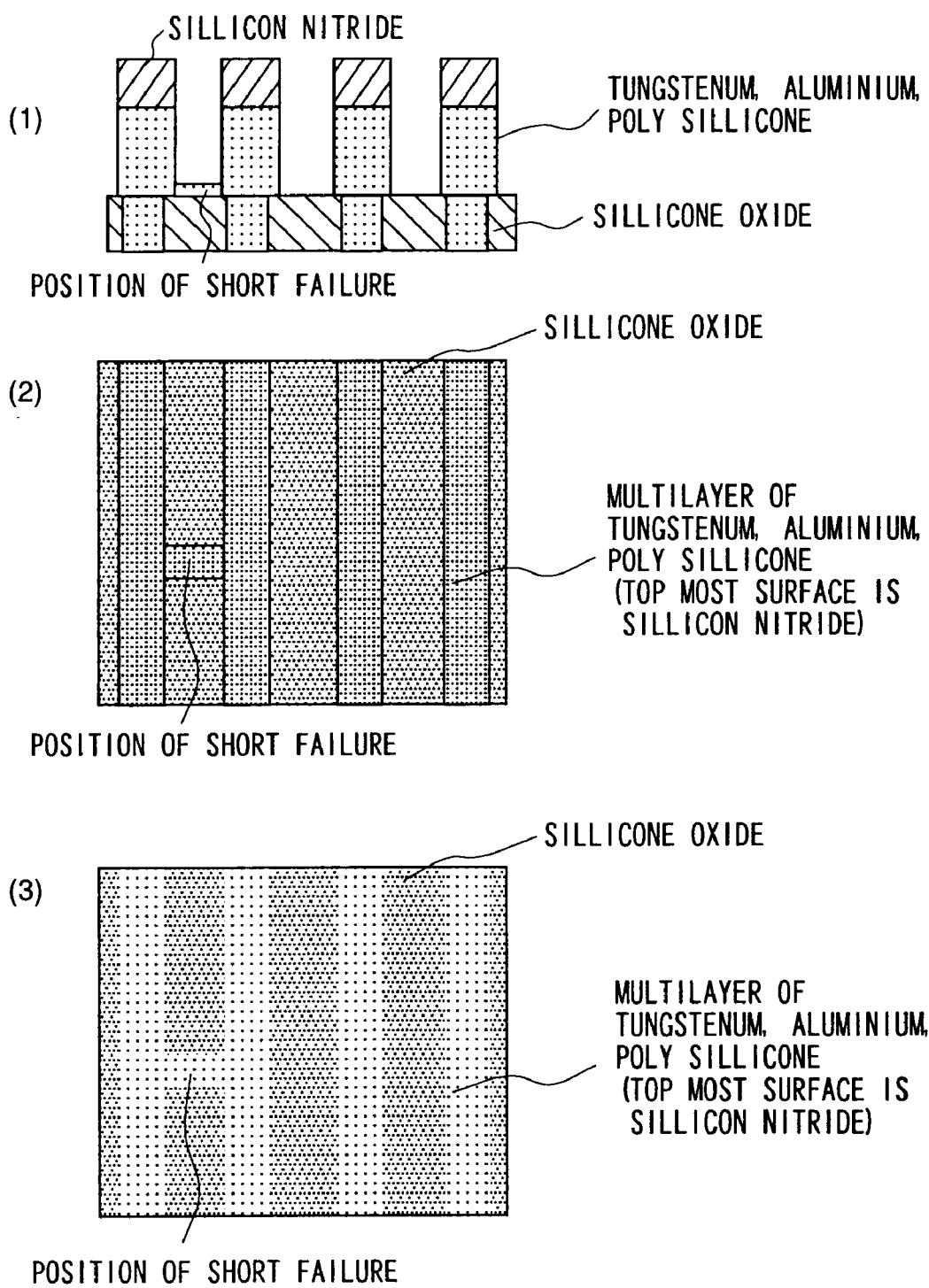
FIG. 11 is a drawing showing image characteristics in the line forming process (different material).
Figure 12:
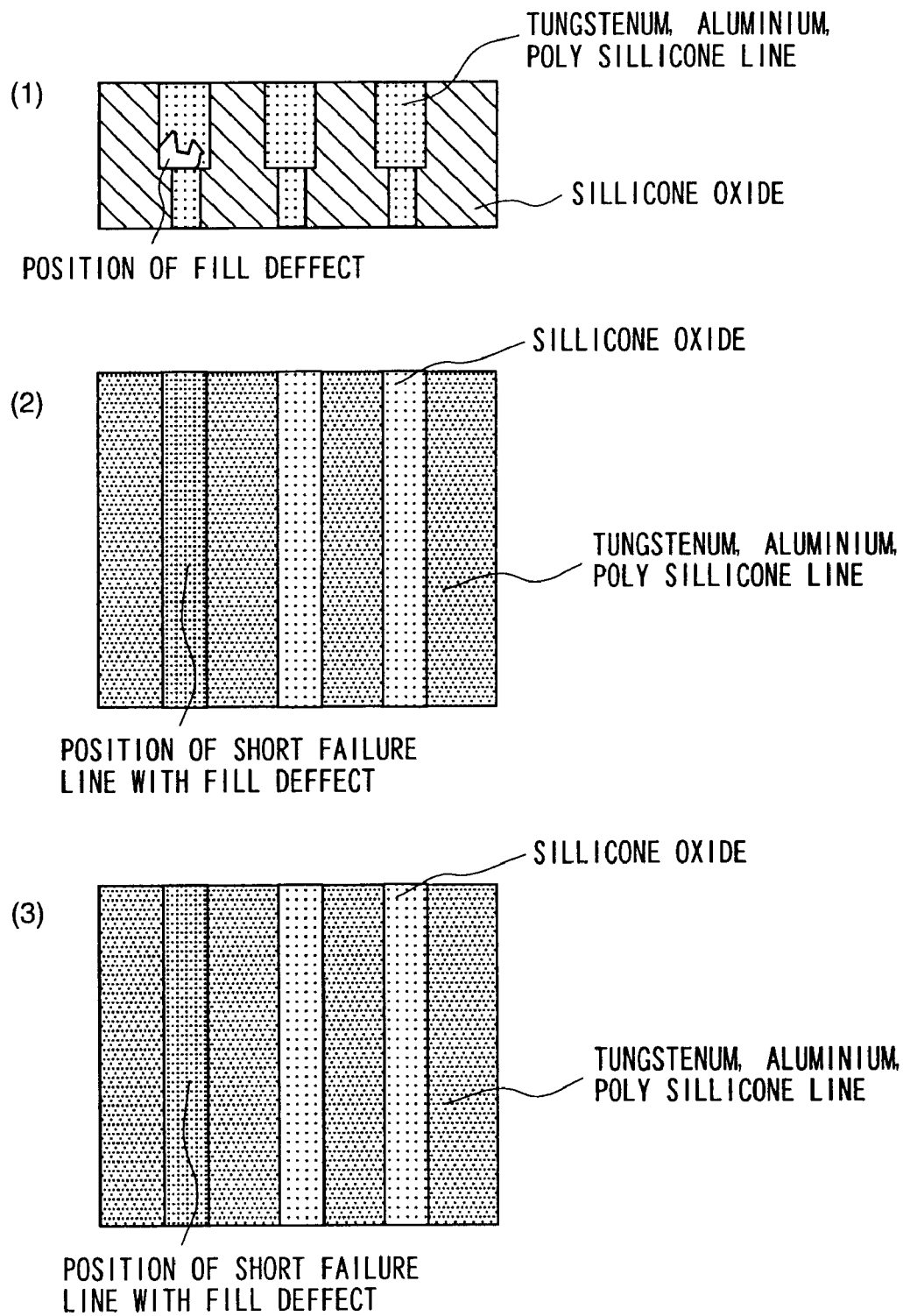
FIG. 12: is a drawing showing image characteristics in the line forming process (filling).

Next, the contrast of the line forming process will be explained. As shown in FIG. 6, the material of lines is, for example, a metal such as aluminum or tungsten or a sub-metal such as polysilicone and on the lower layer, there are many cases that an insulating material such as a silicon oxide film is used (FIG. 10(1)). In such a case, the lower layer is an insulating material and the surface is a conductive material, so that even if the electron beam irradiation energy is low or high, a contract can be obtained. FIG. 10(2) shows an example of an image obtained with irradiation energy of 500 V to 1 kV and FIG. 10(3) shows an example of an image obtained with 3 kV to 5 kV. However, when a failure to be detected is a failure such as a short existing at the bottom of the lines having a large step, as shown in FIG. 10(3), a comparatively high irradiation condition is desirable. In another line example, when the surface of the line material is covered with a material close to an insulating material such as a silicon nitride film or a titanium nitride film, for example, in the case of FIG. 11(1), a combination of a silicon nitride film and a silicon oxide film is irradiated with an electron beam. In such a case, when the electron beam irradiation energy is low, no contrast is generated. FIG. 11(2) shows an image when an electron beam is irradiated with irradiation energy of 500 V to 1 kV. Therefore, when the sample shown in FIG. 11(1) is to be inspected, by setting the irradiation energy to 1 kV or more, preferably to 3 kV or more, a contrast of the silicon nitride film and the silicon oxide film can be obtained and a failure can be easily detected. FIG. 11(3) shows an electron beam image when the irradiation energy is 3 kV. Furthermore, in the manufacturing process (FIG. 12(1)) of grinding the silicon oxide film which is an insulating material by etching first in the line forming process, filling a line material on it, and polishing the surface, since there is no step, there is no need to increase the irradiation energy. In this process, whether the insulating material is conducted to the lines of the lower layer or a line material is filled in the step bottom of the silicon oxide film is questionable, so that in the same way as with the hole forming process, when the irradiation energy is comparatively low, a conduction failure can be easily detected. FIG. 12(2) shows an electron beam image when the irradiation energy is comparatively low such as 1 kV and FIG. 12(3) shows an electron beam image when the irradiation energy is comparatively high. In every image, the failure area can be recognized. However, in the image having a larger contrast difference from that of the lower layer, the failure area can be easily extracted by image comparison, so that it is found that the lower irradiation energy is advantageous.

Next, a case that thin film remains are detected by cleaning (FIG. 13 (1)) will be explained.

Figure 13:
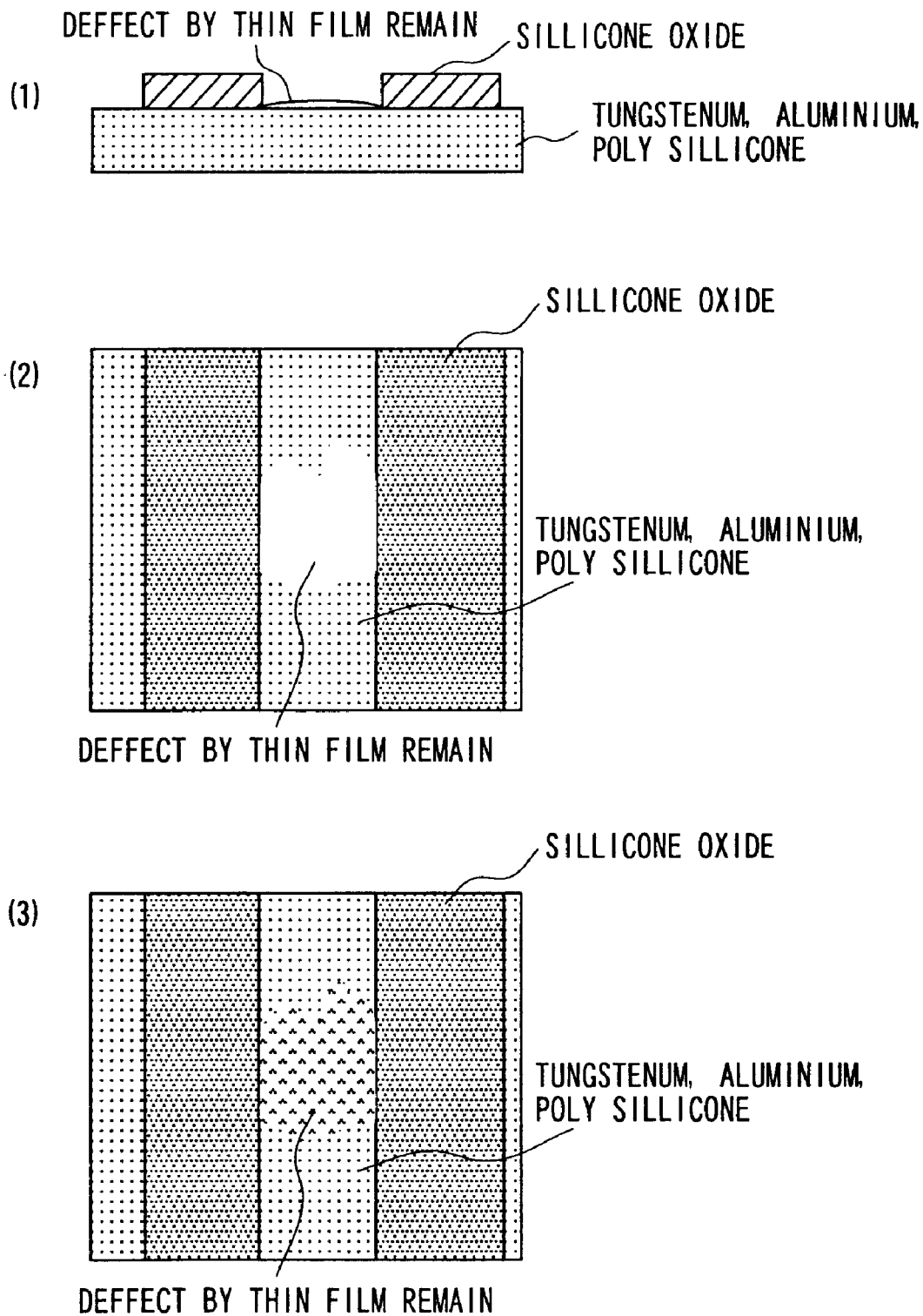
FIG. 13 is a drawing showing image characteristics of a thin film remaining failure in the cleaning process.

FIG. 13(2) shows an electron beam image when an electron beam is irradiated with irradiation energy of 500 V to 800 V and FIG. 13(3) shows an electron beam image when the irradiation energy is set to 5 kV. For example, when the irradiation energy is set to 5 kV, the electron beam almost passes through the thin film, so that information of the existence of a thin film cannot be obtained as an image (FIG. 13(3)). Therefore, when an electron beam is irradiated with comparatively low irradiation energy, the thin film area is more charged than the other areas and a contrast is provided, so that it can be detected easily (FIG. 13(2)).

An example of evaluation of- the contrast characteristics mentioned above will be described hereunder. The electron beam irradiation energy is changed by changing a negative voltage to be applied to each sample and sample carrier and changes in the contrast of each sample are examined. Here, the contrast indicates the rate of the absolute value of the difference between the brightness of the pattern area and the brightness of the lower layer to the mean brightness of an image and it is expressed by a formula of "contrast C (%)=| (brightness of pattern area)−(brightness of lower layer) |/ (mean brightness of image)". This evaluation is placed on an electron beam image obtained under the conditions that the electron beam current is 50 to 100 nA, and the irradiation count of electron beam is one time (no addition), and the beam deflector is 50 to 100 μm, and the pixel size at the time of image acquisition is 0.05 to 0.1 μm, and the signal detection speed is 100 MHz, that is, 10 nA/pixel, and the electron beam diameter is 0.1 to 0.2 μm, and the initial acceleration voltage of electron beam is 10 kV.

Figure 14:
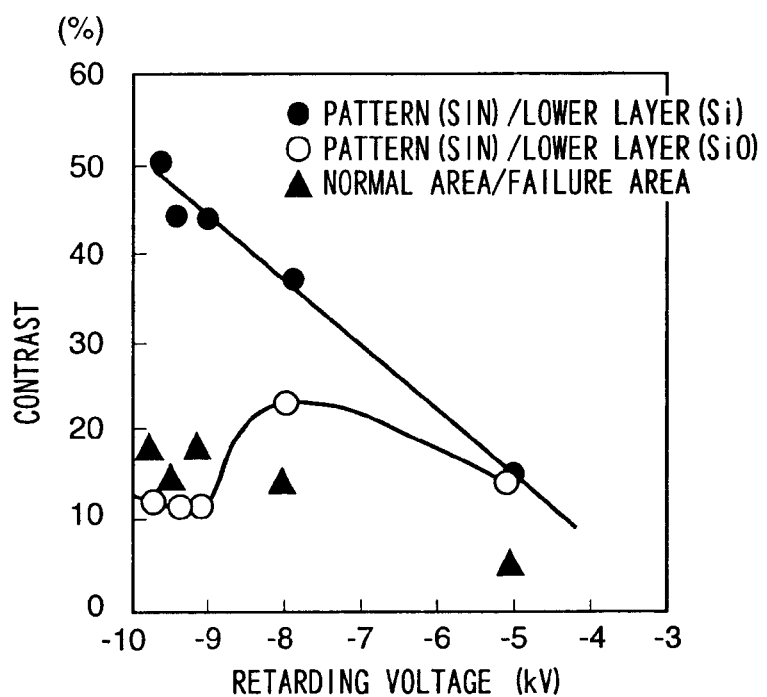
FIG. 14 is a contrast diagram of a circuit pattern.

As a first example, the contract characteristics of a linear circuit pattern A composed of silicone such as a silicon nitride film as a surface material and a silicon oxide film such as a lower layer material are evaluated. In this circuit pattern A, the pattern area step is about 0.15 μm. The characteristics of the circuit pattern A are shown in FIG. 14. In the silicone area of the lower layer, when the electron beam irradiation energy is lower, the contrast between the pattern area and the lower layer is higher. However, in the area of silicon oxide film of the lower layer, the contrast is high in the neighborhood of 7 to 8 kv of retarding voltage, that is, at 2 to 3 kv of irradiation energy. The area where a failure is generated cannot be identified as the silicone area or the silicon oxide film area of the lower layer. Therefore, when the circuit pattern A is to be inspected, in both silicone area and silicon oxide film area, the condition of high contrast is suited. Therefore, in the circuit pattern A having a combination of a silicon nitride film and a silicon oxide film and a step of about 1.5 μm, the condition of a retarding voltage of about 7 to 8 kV, that is, irradiation energy of 2 to 3 kV is an optimum value for inspection.

Figure 15:
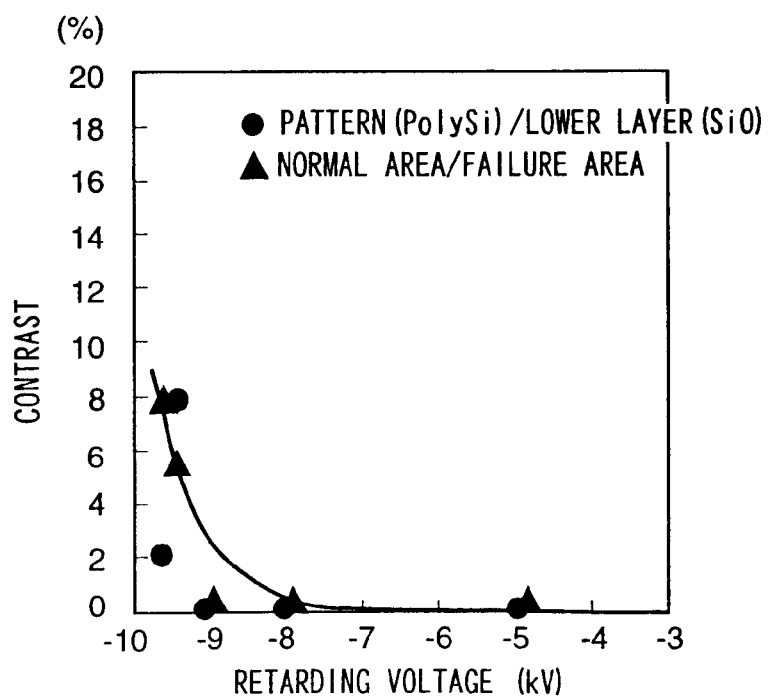
FIG. 15 is a contrast diagram of a circuit pattern.

As a second example, the contrast characteristics of a circuit pattern B that a hole pattern is filled with a conductive material and the surface is polished flat are evaluated. The material of the periphery of the hole is a silicon oxide film and the conductive material inside the hole is ion-doped polysilicone or tungsten. The characteristics of both cases are similar and this example uses ion-doped polysilicone. Since the surface is polished flat, there are few steps. The contrast characteristics of the circuit pattern B are shown in FIG. 15. When the retarding voltage is higher, that is, the electron beam irradiation energy is lower, the contrast between the silicon oxide film area around the hole and the polysilicone area inside the hole is higher. As the irradiation energy increases, the contrast becomes almost 0% and it is difficult to distinguish between the hole pattern and the periphery on an image and as a result, the failure inspection is difficult. Therefore, in the circuit pattern B that the surface is flat and a conductor and an insulating material are combined, the condition that the electron beam irradiation energy is 500 V or less is an optimum value for inspection. For the potential contrast failure inspection, low irradiation energy is advantageous.

Figure 16:
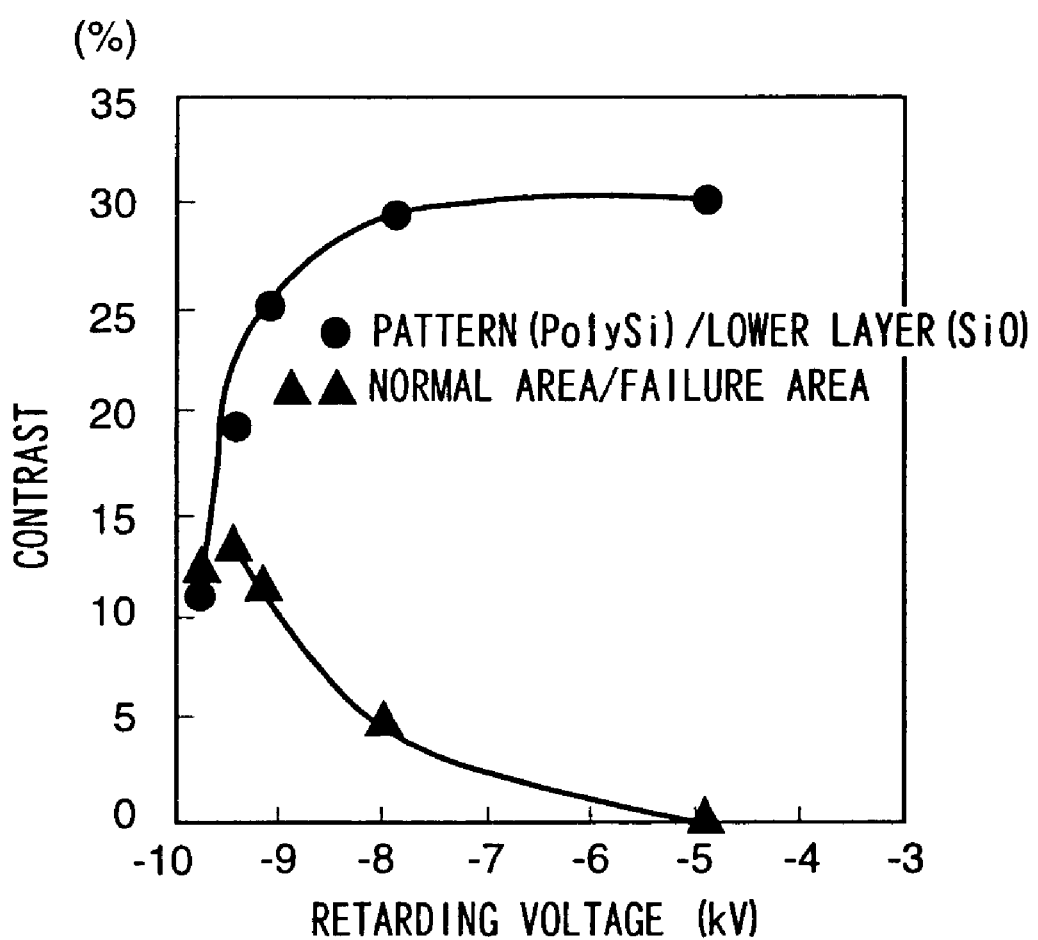
FIG. 16 is a contrast diagram of a circuit pattern.

As a third example, the contrast characteristics of a circuit pattern C having a surface of transistor patterns which are composed of conductive polysilicone and insularly independent and a lower layer of a polysilicon oxide film are evaluated. The isolated pattern area of the circuit pattern C has a step of about 1 µm against the lower layer. The contrast characteristics of the circuit pattern C are shown in FIG. 16.

In the circuit pattern C, when the retarding voltage lowers, that is, the irradiation energy increases, the contrast increases. When the irradiation energy is 1 kV or more, the contrast is 25% or more and furthermore, when the irradiation energy is 3 kV or more, the irradiation energy is 30% or more. Therefore, in the circuit pattern C having a large step, the condition of irradiation energy of 3 kV or more is an optimum value for inspection. For the high step pattern inspection, high irradiation energy is advantageous.

An example is explained above. As shown in FIG. 6, when the step is high, the irradiation energy is set high (1 kV or more) and when the step is low or none, the irradiation energy is set low (3 kV or less). In a combination of a conductive material and an insulating material, even if the irradiation energy is low or high, a contrast can be obtained, while in a combination of an insulating material and an insulating material, the irradiation energy is set to 1 kV or more and a contrast is obtained by the difference in the charging state by the material. Furthermore, when a shape failure is to be detected, it is necessary to set the irradiation energy to 500 kV or more, preferably to 1 kV or more and when a potential contrast failure, that is, an electrical failure such as a conduction failure or a short is to be detected, it is necessary to set the irradiation energy to 3 kV or less, preferably to 1 kV or less. When these conditions are input in the inspection condition data base of the inspection device 1 beforehand and the conditions of step and material are input, the irradiation energy suited to the inspection can be searched for.

As mentioned above, a circuit pattern inspection method characterized in that an item indicating the state of a circuit pattern to be inspected is identified on the operation screen, and the contrast of an electron beam image corresponding to it is confirmed, and the electron beam irradiation conditions including the electron beam voltage are obtained and stored, and the state of the circuit pattern to be inspected is displayed on the operation screen, and the electron beam irradiation conditions are decided using the stored electron beam irradiation conditions of the displayed screen, and the electron beam is irradiated and scanned to the circuit pattern to be inspected under the above electron beam irradiation conditions once, and an electron beam image is formed, and the inspection is executed and a circuit pattern inspection method characterized in that an item indicating the state of a circuit pattern to be inspected is identified on the operation screen, and the contrast of an electron beam image corresponding to it is confirmed, and the electron beam irradiation conditions including the electron beam voltage are obtained and stored, and the state of the circuit pattern to be inspected including the material or step of the circuit pattern to be inspected and the kind of a failure to be detected is displayed on the operation screen, and the electron beam irradiation conditions are decided using the stored electron beam irradiation conditions of the displayed screen are provided.

Figure 17:
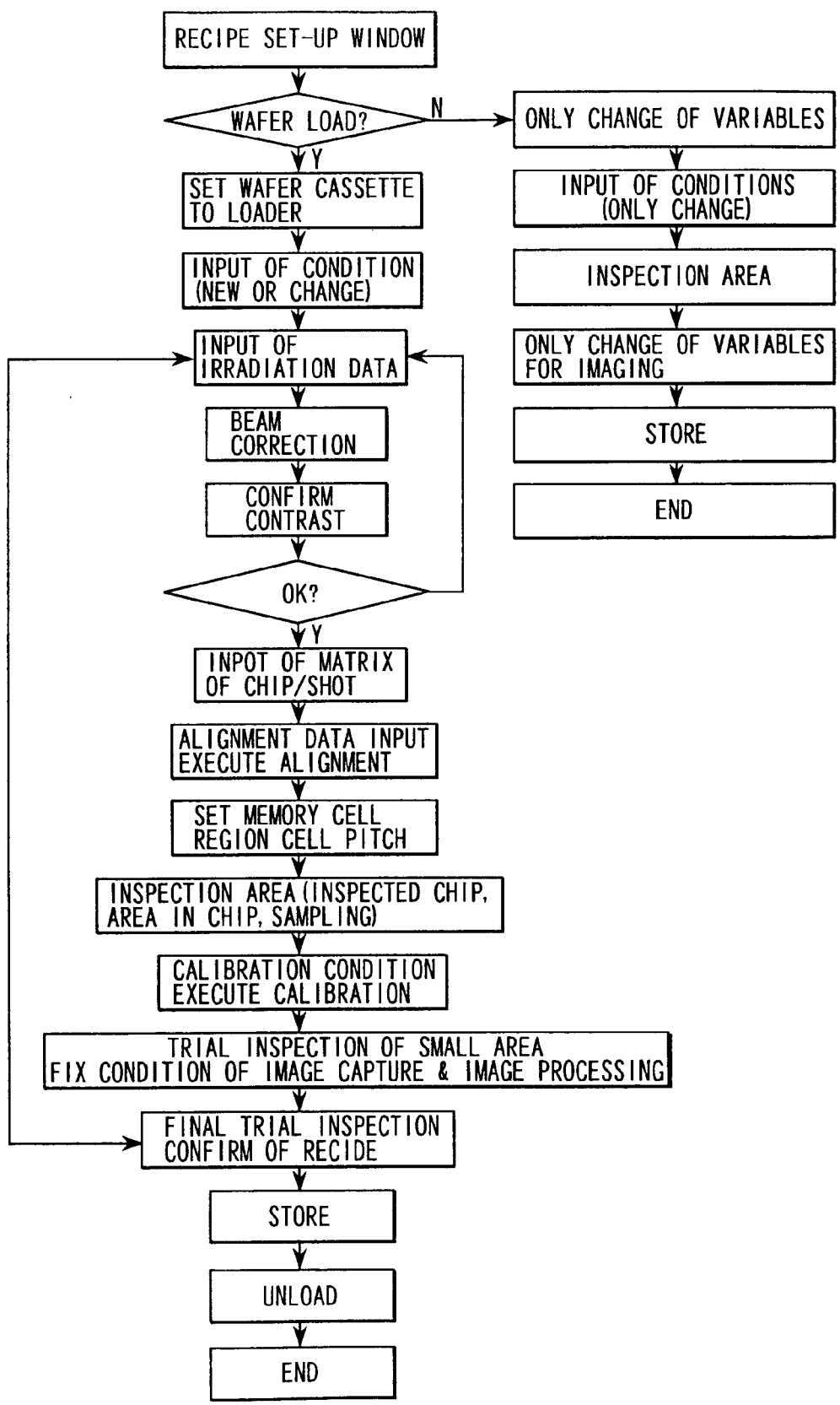
FIG. 17 is a drawing for explaining the flow of inspection condition setting.
Figure 18:
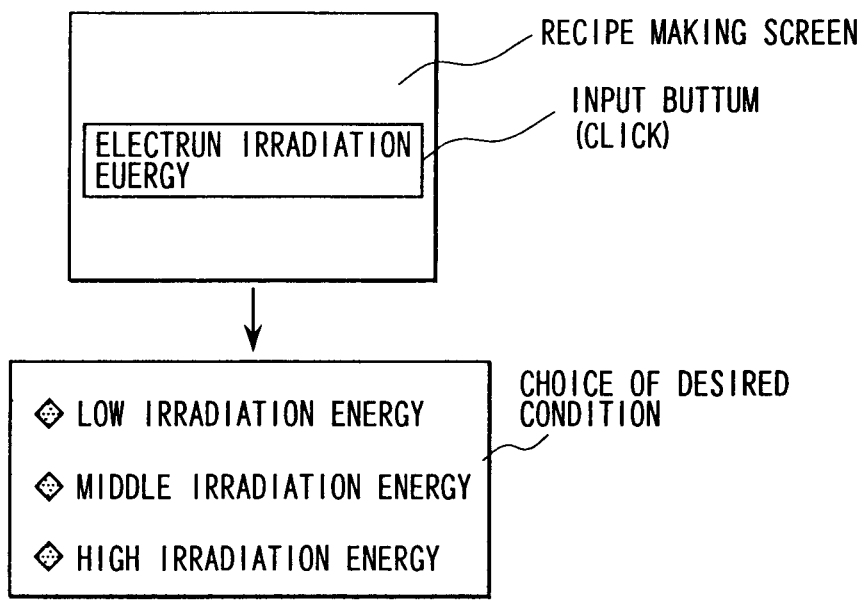
FIGS. 18(1–3) is a drawing showing the electron beam irradiation energy setting method.
Figure 18:
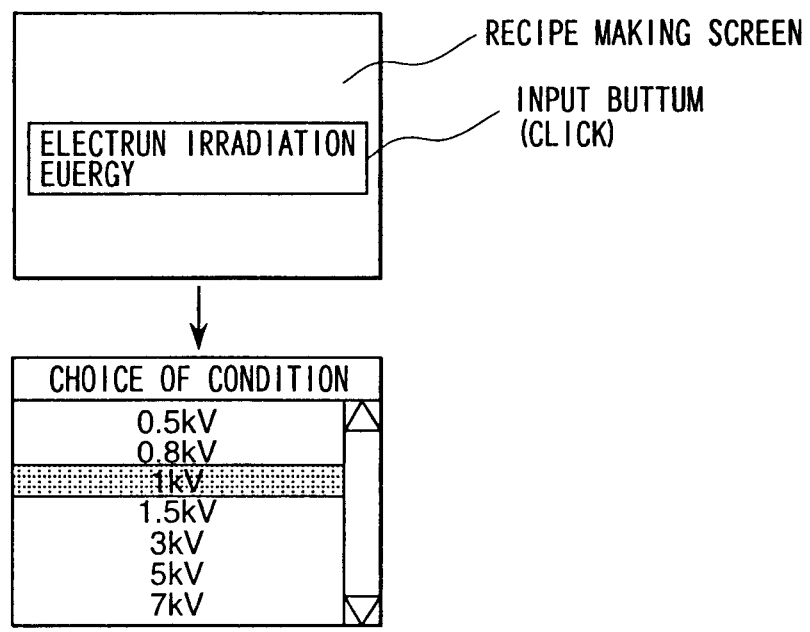
Figure 18:
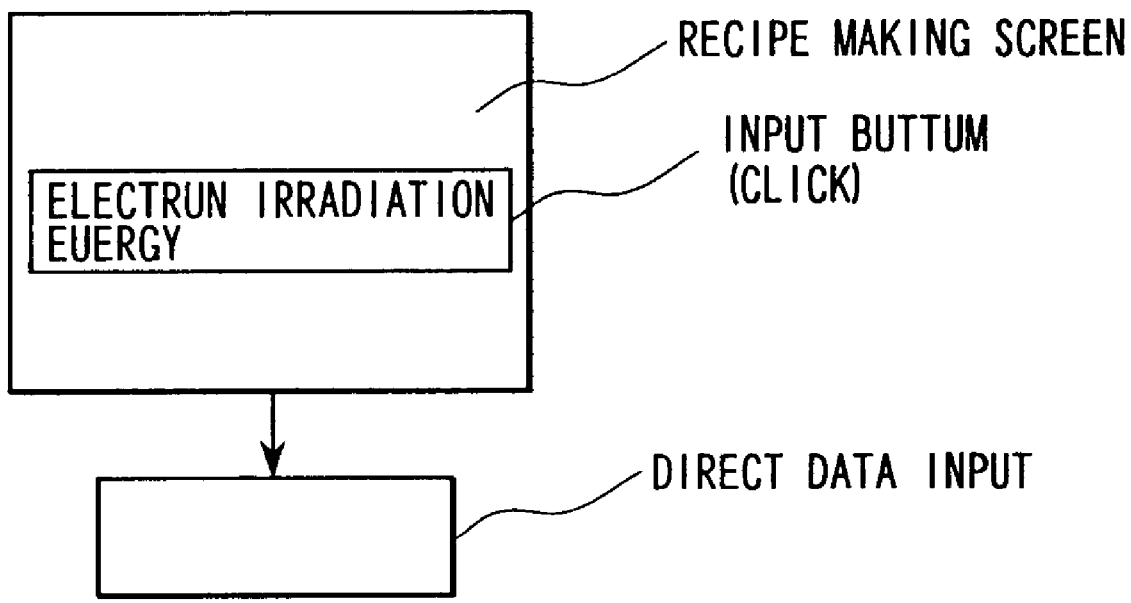
Figure 19:
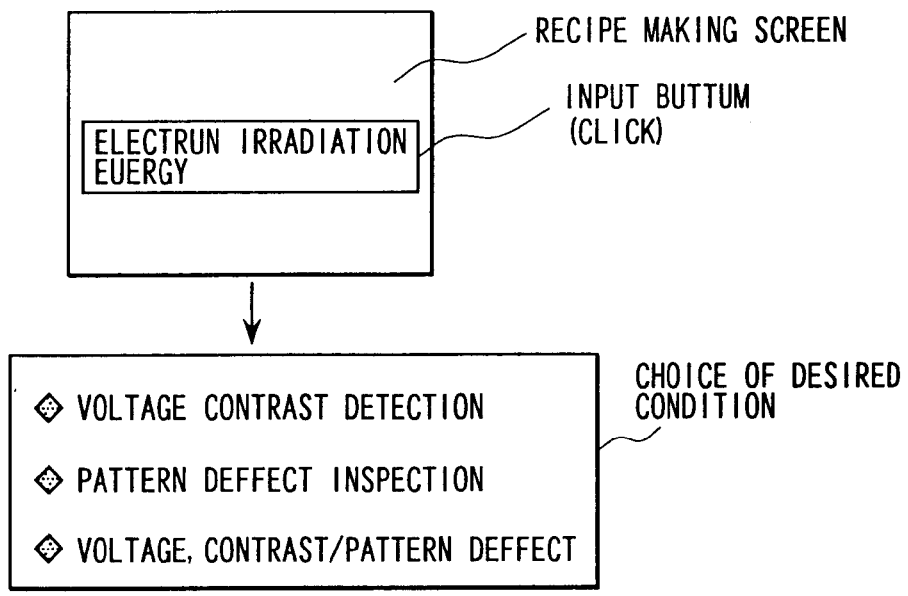
FIGS. 19(1–3) is a drawing showing the electron beam irradiation energy setting method.
Figure 19:
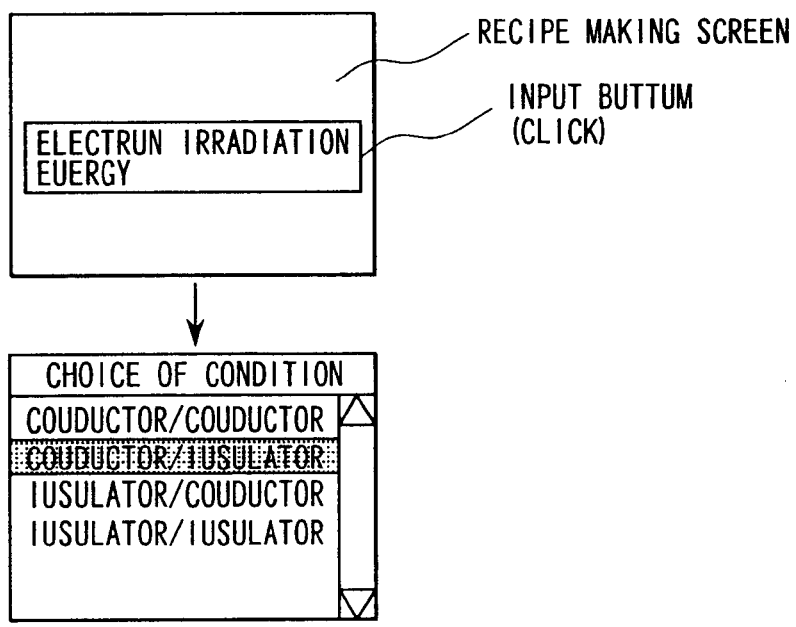
Figure 19:
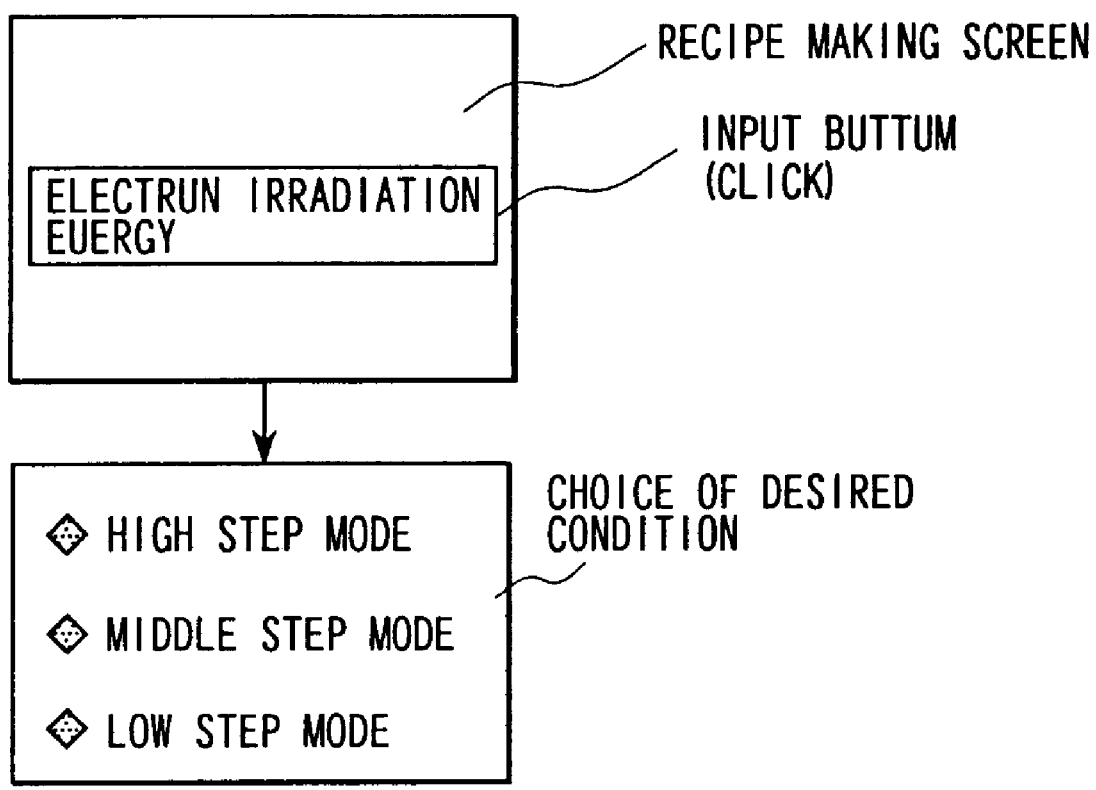
Figure 20:
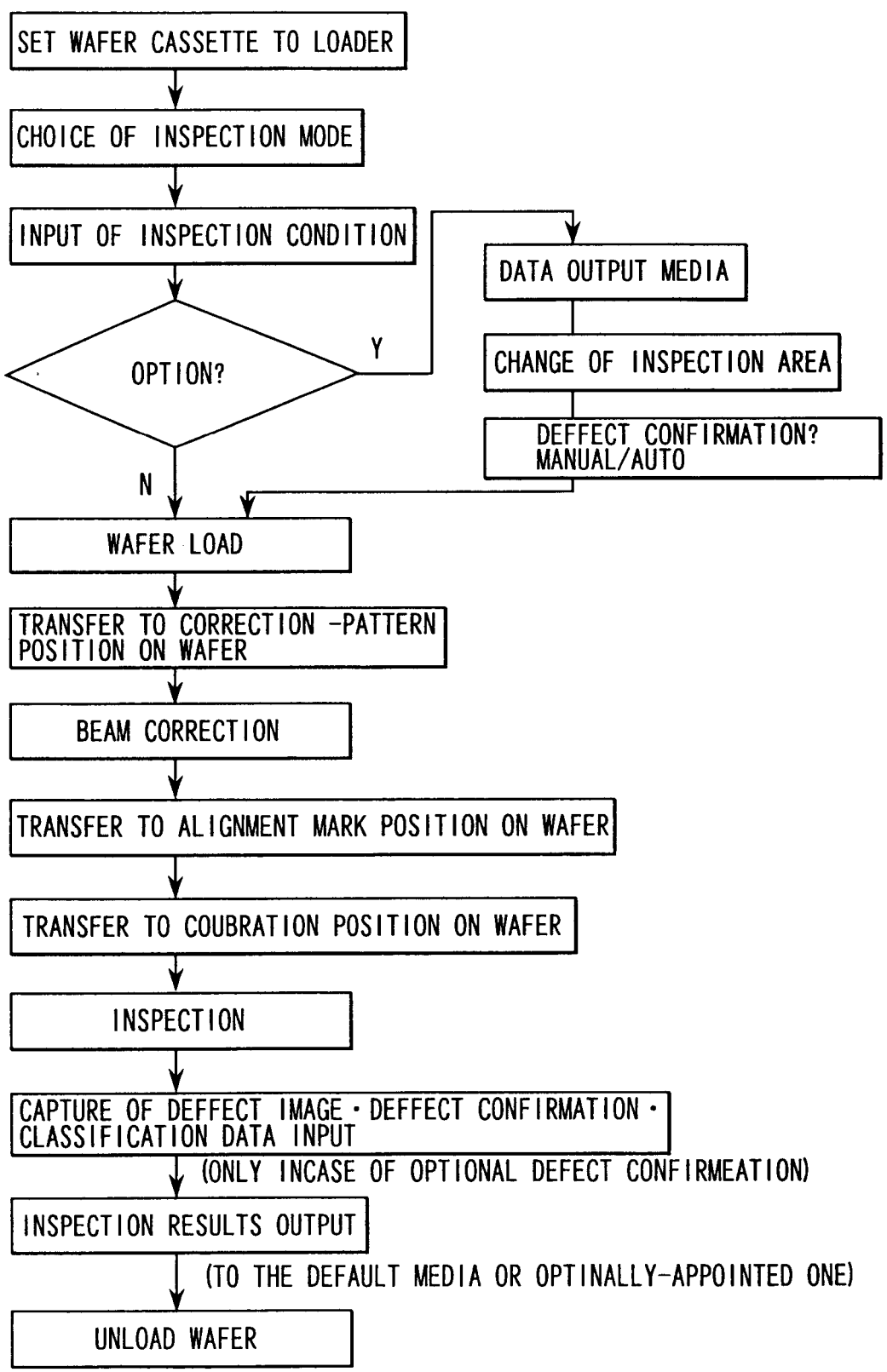
FIG. 20 is a drawing showing the flow of automatic inspection.

Next, the flow of actual inspection execution using the electron beam irradiation energy conditions described above will be explained. In FIG. 17, the flow of setting of inspection conditions is shown. On the operation screen, the mode for preparing inspection conditions (hereinafter referred to as a recipe) is selected. A wafer is actually loaded in the inspection device. When a recipe is already prepared, whether the previous recipe is to be edited and corrected as a new recipe or an exactly new recipe is to be prepared is selected. Before obtaining an image to which an electron beam is irradiated, the electron beam irradiation conditions are selected. The details will be easily understood by referring to FIG. 17. Here, the electron beam irradiation energy is selected from several selection items shown in FIG. 18. One of the selection methods is to prepare several stages of electron beam irradiation energy beforehand and directly select and input the stage value. For example, in the example shown in FIG. 18, one of the three stages of low irradiation energy, middle irradiation energy, and high irradiation energy is selected. In the example shown in FIG. 18(2), the numerical value of irradiation energy which can be set is selected. In the example shown in FIG. 18(3), the numerical value of irradiation energy is input. Another selection method is shown in FIG. 19. In this method, when the parameters of material and shape are selected, an appropriate irradiation energy range is set. In the example shown in FIG. 19(1), one of the three modes such as the shape failure inspection mode, the potential contrast failure inspection mode, and the intermediate mode, that is, the mode corresponding to both is selected. In the example shown in FIG. 19(2), the inspection mode is selected from "Conductor/Insulator", "Conductor/Conductor", and "Insulator/Insulator". Furthermore, in the example shown in FIG. 19(3), the electron beam irradiation energy is set by selecting one from "High step", "Middle step", and "Low step (no step)". In selection of these conditions, they can be searched for independently or by combination. For example, when an electrical failure is to be inspected in a semiconductor wafer after the hole is filled with a conductor and flattened in the hole forming process, by selecting "Conductor/Insulator" first, selecting the condition of "No step" next, and selecting the potential contrast failure inspection mode, the result that the recommended electron beam irradiation energy is within the range from 300 V to 1 kV and the most recommended value is 500 V is displayed on the screen and the recipe preparation is promoted using this recommended value. The irradiation energy conditions are set by the method shown in FIG. 18 or 19, and a negative potential is applied to the sample carrier according to the irradiation energy, and various device parameters are automatically set in connection with it. After the irradiation energy is set, the stage automatically moves to the location of the electron beam calibration pattern attached to the sample carrier and an electron beam is irradiated to the calibration pattern. When the electron beam is continuously irradiated to a semiconductor wafer to be inspected or the calibration pattern, the contrast is changed by the effect of charging or contaminations are adhered to it, so that to suppress it, an electron beam image is obtained and in addition to inspection execution, the electron beam is irradiated to the blanking plate installed midway in the optical system by the blanking electrode using an image of the beam calibration pattern, automatically or using the console or the knob on the screen, the parameters requiring fine adjustment of the focus and astigmatism are adjusted by actually using an electron beam image. Thereafter, the electron beam is actually irradiated onto the semiconductor wafer to be inspected 9, and an image is formed, and the contrast is confirmed on the monitor, and the irradiation energy can be changed as required. On the semiconductor wafer to be inspected 9, the focus and astigmatism can be adjusted once again. When the adjustment and contrast confirmation are finished, the size and arrangement of shots and chips are input as required according to the circuit pattern on the semiconductor wafer. Next, the alignment conditions for correcting the scanning direction of the electron beam for the semiconductor wafer to be inspected and the moving direction of the sample carrier are set. Concretely, when the same pattern is selected on the two chips arranged in parallel, and the image and coordinates of the pattern are registered in the memory beforehand, and the offset values of the coordinates of the pattern and the home positions of the chips are input, and then the alignment is executed, the correct ion of wafer rotation, the correction of position, and the home position of each chip are decided. Thereafter, the repetitive pattern area such as the memory cells in the chips is set and for the repetitive pattern area, the repetitive unit, that is, the pitch is set. Next, the inspection area is designated. In the designation of the inspection area, the inspection chip and inspection area in the chip can be designated. With respect to the area other than repetition such as the memory cells, the area to be inspected can be set by an optical microscope image or an electron beam image. When the designation of the inspection area is finished, the processing goes to calibration setting for adjusting the brightness at the time of inspection. In the calibration, an electron beam image is obtained, and the offset correction is executed for the gain and brightness according to a signal from the brightness distribution, and the adjustment is executed so as to obtain an appropriate brightness distribution. An optional chip is selected, and the coordinates for obtaining an electron beam image for executing the calibration in the chip is designated, and the calibration is actually executed, and the result is confirmed, and the conditions are registered. In a conventional inspection device, the contrast is not optimized by adjusting the electron beam irradiation conditions according to a circuit pattern to be inspected, so that the calibration is executed in the state that no contrast is obtained, and as a result, the inspection must be executed in the state that it is apt to be adversely affected by noise, and conditions for detecting a failure without a maldetection cannot be set in the failure detection condition setting which will be described later. In this embodiment, at the first stage of obtaining an electron beam image at the time of recipe preparation, the appropriate electron beam irradiation conditions are input according to a semiconductor wafer to be inspected, and then a recipe is prepared by obtaining an electron beam image under the conditions, and the inspection can be executed, so that by executing the calibration, the brightness distribution suited to inspection can be obtained.

When the setting of calibration conditions and the calibration are completed, an image is obtained by the same method as that of the actual inspection under various conditions which are set above and the image processing conditions for detecting a failure are set. When an image is to be obtained, the kind of a filter to be applied to a detection signal is selected, and images are obtained for one chip in one scanning width in the same state as that of the inspection, and the threshold value for deciding a failure and others is input, and the location in the obtained images which is decided as a failure is displayed, and whether a failure is actually detected or a maldetection occurs is confirmed, and the threshold value is adjusted to an appropriate value.

Finally, to consider the margin for variations of the process in the wafer surface, an optional area is set within a range wider than one chip mentioned above, and the inspection is actually executed under various conditions which are set until then, and the contents of a detected failure or maldetection are confirmed, and when the conditions are appropriate conditions finally, they are registered as an inspection recipe file for the semiconductor wafer to be inspected.

After a recipe is prepared and registered, the automatic inspection is executed. The inspection flow is shown in FIG. 17. In the inspection, the inspection condition file which is set and registered by the aforementioned method is selected on the screen, and the option conditions such as output of the inspection area and results are input, and inspection execution is selected, thereby a wafer is loaded and various parameters are set according to the inspection condition file. With respect to the electronic optical system, various parameters are automatically set according to the electron beam irradiation conditions designated by the recipe, and the beam calibration is executed, and the designated inspection area is inspected under various conditions set by the recipe via execution of the alignment and execution of the calibration, and the contents of a failure is confirmed as required, and the results are output, and the wafer is unloaded, and the inspection is finished.

By executing the inspection using the inspection method and inspection device described above, even if there are various different surface materials, structures, and kinds of failures depending on the manufacturing process of semiconductor wafers to be inspected, when an electron beam image which is highly precise and of good quality is obtained, compared, and inspected, various minute failures generated in a fine circuit pattern or electrical failures can be detected. In the prior art, there are steps which are easily inspected and steps which cannot be inspected. The inspection method and inspection device of this embodiment can correspond to various combinations of processes and materials and a stable inspection can be executed.

Next, an application example that a semiconductor wafer is inspected using the circuit pattern inspection device 1 and method of the present invention will be described. As described in FIGS. 2, 3, and 4, in the semiconductor device manufacturing process, many patterning processes are repeated. In these patterning processes, when the manufacturing conditions are not optimized, there is the possibility that various failures are generated.

Therefore, when the circuit pattern inspection method and device 1 are applied to the semiconductor device manufacturing process, an occurrence of an error can be detected highly precisely and early, and an error trouble shooting action can be taken for the corresponding step, and the processing conditions can be optimized so as to prevent failures from generation. For example, when the circuit pattern inspection process is executed after the development process and a failure or open wiring of the photo resist pattern is detected, the situation that the exposure conditions of the exposure device in the exposure to light process and focusing conditions are not optimum is inferred and the conditions are immediately improved by adjustment of the focusing conditions or exposure amount. By checking (detecting) from the failure distribution whether those failures are generated commonly between the shots or not, a failure in the photo mask and reticle used for patterning is inferred and inspection and exchange of the photo mask or reticle is executed promptly. When the contact hole is not conducted, the situation that the etching amount is insufficient or a reaction error occurs during etching is inferred and as a result, countermeasures such as the optimization by resetting of the etching amount and cleaning emphasis after etching are fed back. The same may be said with the other processes and by applying the circuit pattern inspection method and device of the present invention and executing the inspection process, various failures are detected and the error cause of each manufacturing process is inferred by the contents of the detected failure.

As mentioned above, when the circuit pattern inspection method and,device 1 are operated inline in the semiconductor device manufacturing process, changes in various manufacturing conditions and an occurrence of an error can be detected during inspection execution, so that a large number of failures can be prevented from occurring. The circuit pattern inspection method and device are applied and from the level of a detected failure and the occurrence frequency of failures, the total acceptable product obtaining rate of the semiconductor device can be estimated and the semiconductor device productivity can be improved.

Next, the electron beam irradiation energy is changed according to various semiconductor wafers to be inspected. In the device constitution shown in FIG. 1, the negative voltage to be applied to the sample carrier is fixed. By changing the acceleration voltage of the electron gun 10, the electron beam irradiation energy to be irradiated to a sample is changed. In this case, it is necessary also to change the conditions of the capacitor lens 12 and the object lens 16 for focusing the electron beam. It is also necessary to change the deflection conditions of the electron beam. Such parameters of the units relating to the acceleration voltage are stored as a data base of the device and when the acceleration voltage is to be changed, these parameters are automatically set. By doing this, the optical axis adjustment required when the acceleration voltage is changed can be minimized and by keeping the negative voltage to be applied to the sample carrier constant, the potential distribution on the sample surface can be kept constant. Since the electron beam irradiation conditions to a semiconductor wafer to be inspected are the same as those of Embodiment 1, they are omitted. Since the electron beam irradiation condition setting method, recipe preparation procedure, and inspection flow are also the same as those of the example previously described, they are omitted.

Figure 21:
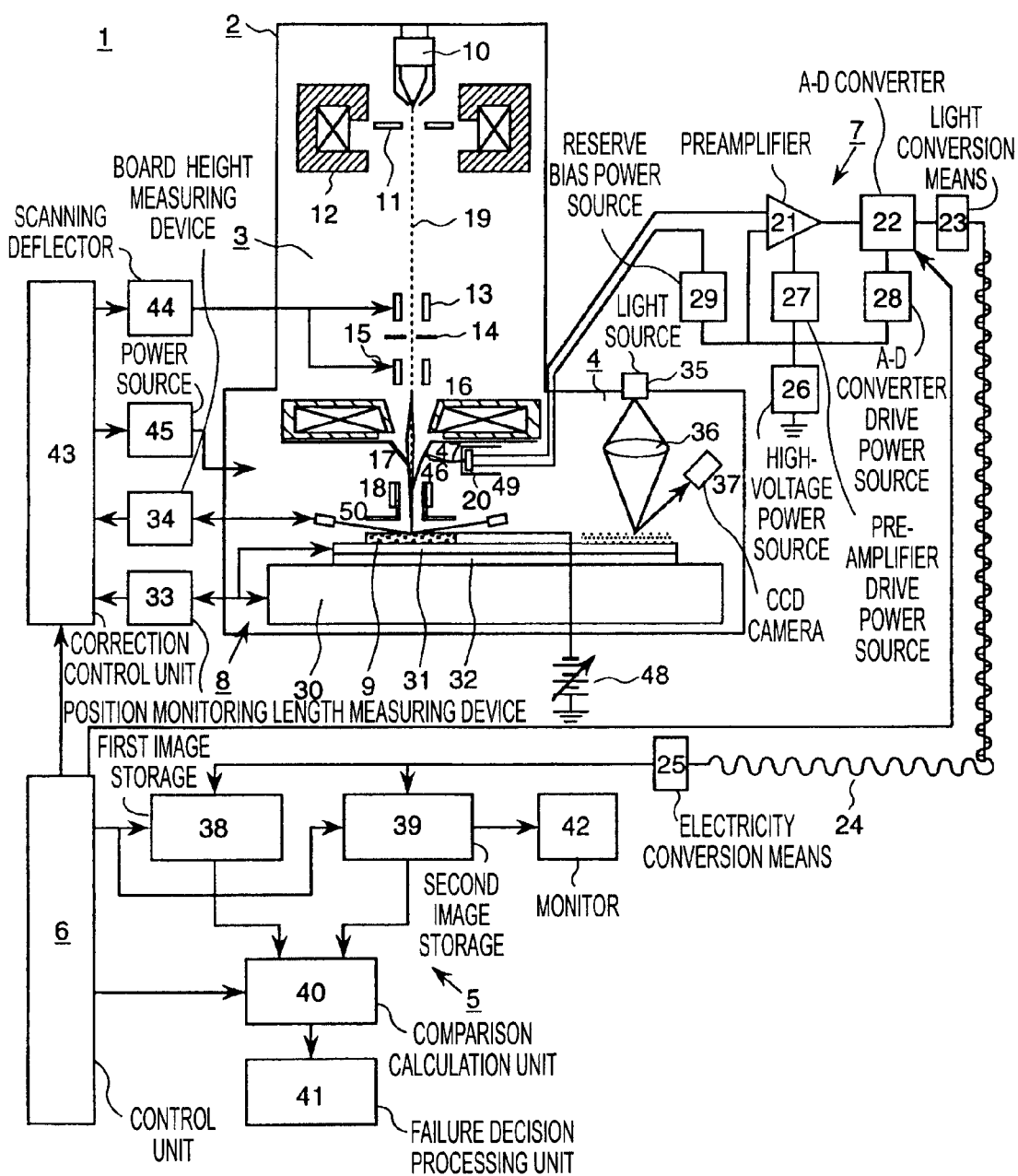
FIG. 21 is a drawing showing the constitution of the essential section of the electronic optical system of another example.

Next, as shown in FIG. 21, the object lens 16 in the electronic optical system 3 is installed above the secondary electron detector 20. The constitution of the inspection device is the same as that of the previous example. The constitution of the circuit pattern inspection device is shown in FIG. 21. The electron beam 19 is irradiated to the sample board to be inspected 9. To the sample board to be inspected 9, a negative high voltage is applied. In this example, the negative voltage for decelerating primary electrons to be applied to the sample board to be inspected 9 is set to −9 keV. By irradiation of the electron beam, the secondary electrons 46 are generated from the surface of the sample board 9 by the operation previously described. The secondary electrons 46 generated from the surface of the sample board 9 is suddenly accelerated to 9 keV by the negative voltage applied to the sample board 9, so that the secondary electrons 46 generated from the board surface 9 are oriented and the extent of the secondary electrons 46 accelerated when they collide with the reflection plate 17 is small such as several mm, accordingly even if the secondary electrons 46 are not focused by the object lens 16, the detection efficiency will not be reduced. Therefore, even in the constitution of this example that the object lens 16 is arranged at the position where only the primary electron beam 19 is focused, the accelerated secondary electrons 46 collide with the reflection plate 17 and the generated second secondary electrons 47 are detected highly efficiently and converted to a signal, so that a good electron beam image can be obtained. According to this embodiment, the focal length of the object lens 16 is made longer than that of the previous example, so that as a result, even if the primary electron beam 19 is deflected larger than that of the previous example, the resolution and accuracy can be maintained. The other constitution and operation are the same as those of the previous example, so that they are omitted here. Since the method and device for changing the electron beam irradiation energy according to the kind of a semiconductor wafer to be inspected as an electron beam irradiation condition are explained already, they are omitted here.

With respect to the constitution of the typical device of this patent application and the inspection method of a circuit pattern to be inspected, the method for obtaining an electron beam image of good image quality by controlling the conditions of an electron beam to be irradiated according to the material, step, and shape of a circuit pattern to be inspected and the kind of a failure to be inspected, particularly the irradiation energy and obtaining an appropriate contrast and the method for improving the productivity of the manufacturing process of a board having a circuit pattern of a semiconductor device and others by executing the circuit pattern inspection of the present invention are explained above by referring to partial embodiments. However, within a range which is not deviated from the range of the present invention, an inspection method and an inspection device combining a plurality of characteristics stated in the claims are: also available.

The typical effects obtained by this patent application will be explained simply hereunder.

By inspecting a board of a semiconductor device having a circuit pattern using the circuit pattern inspection device of this patent application, the inspection of a circuit pattern formed by a silicone oxide film or resist film transmitting light which cannot be detected by the conventional optical pattern inspection can be realized within the inspection time which can be put into practical use in the manufacturing method of semiconductor devices and others. Conventionally, there is a case that a circuit pattern cannot be inspected due to a different surface material and shape or the failure detection capacity reduces depending on the kind of a semiconductor to be inspected, steps, manufacturing method, and process. However, by the inspection method and inspection device of this patent application, even in such a case of difficult inspection, by setting optimum electron beam irradiation conditions, the good contrast suited to inspection can be obtained and as a result, a highly sensitive inspection can be realized for semiconductor wafers under various conditions. Moreover, by changing the charging state of the surface of a semiconductor wafer to be inspected without adversely affecting the inspection time, the aforementioned highly sensitive inspection can be realized.

When this inspection is applied to the board manufacturing process, a failure which cannot be detected by the aforementioned prior art, that is, an error in the manufacturing device and conditions can be discovered early and highly, so that an error recovery action can be taken promptly for the board manufacturing process and as a result, the failure rate of boards of semiconductor devices and others is reduced and the productivity can be enhanced. By application of the aforementioned inspection, an occurrence of an error can be detected promptly, so that a large amount of failures can be prevented from occurring and furthermore, as a result, the occurrence of a failure itself can be reduced. Therefore, the reliability of a semiconductor device can be enhanced, and the development effect of a new product is improved, and the manufacturing cost is reduced.

What is claimed is:

1. A circuit pattern inspection method comprising:

a step of scanning a board surface with a circuit pattern formed with an electron beam;

a step of detecting a signal secondarily generated from said board surface by said electron beam;

a step of forming an electron beam image of said board surface from said detected signal;

a step of storing said electron beam image;

a step of forming and storing electron beam images of areas neighboring said board;

a step of comparing said electron beam images of said areas neighboring said board; and a step of deciding a failure of said circuit pattern on said board from results of said step of comparing, wherein said method identifies an item indicating the state of said circuit pattern to be inspected on an operation screen, confirms the contrast of an electron beam image corresponding to it, obtains and stores electron beam irradiation conditions including an electron beam voltage, displays said state of said circuit pattern to be inspected regarding the material or step of said circuit pattern to be inspected and the kind of failure to be detected on said operation screen, and decides and executes said electron beam irradiation conditions using said electron beam irradiation conditions stored on said displayed screen.

2. A circuit pattern inspection method according to claim 1, wherein said method further comprises a step of obtaining said electron beam irradiation conditions from the contrast of said electron beam image as a step of finding said conditions.

3. A circuit pattern inspection method according to claim 1, wherein said method builds, sets, and stores a database for various kinds of inspection conditions including said electron beam irradiation conditions beforehand and reads said database at the time of inspection execution as a step of setting said electron beam irradiation conditions according to said circuit pattern to be inspected.

4. A circuit pattern inspection method according to claim 1, wherein the irradiation energy of said electron beam to a sample is set by a negative voltage applied to said sample and a sample carrier.

5. A circuit pattern inspection method according to claim 1, wherein the beam current of said electron beam is set by a voltage of an electrode and a current of a coil installed in an electronic optical system.

6. A circuit pattern inspection method comprising:

a step of, scanning a board surface with a circuit pattern formed with an electron beam;

a step of detecting a signal secondarily generated from said board surface by said electron beam;

a step of forming an electron beam image of said board surface from said detected signal;

a step of storing said electron beam images;

a step of forming and storing electron beam images of areas neighboring said board in the same way;

a step of comparing said electron beam images of said two areas, and a step of deciding a failure of said circuit pattern on said board from comparison results;

wherein said method identifies an item indicating the state of said circuit pattern to be inspected on an operation screen, confirms the contrast of an electron beam image corresponding to it, obtains and stores electron beam irradiation conditions including an electron beam voltage, displays said state of said circuit pattern to be inspected on said operation screen, decides said electron beam irradiation conditions using said electron beam irradiation conditions stored on said displayed screen, sets alignment conditions for correcting the scanning direction of said electron beam for a semiconductor wafer to be inspected and the moving direction of a sample carrier, sets an inspection area for said semiconductor wafer to be inspected, sets calibration conditions for adjusting the brightness during inspection on the basis of said electron beam irradiation conditions, forms an electron beam image under said conditions, displays it on said screen, and executing the inspection.

* * * * *